US009880193B2

(12) United States Patent
Riley et al.

(10) Patent No.: US 9,880,193 B2
(45) Date of Patent: Jan. 30, 2018

(54) DEVICE DRIVEN INERTIAL INTERFERENCE COMPENSATION

(71) Applicant: QUALCOMM Incorporated, San Diego, CA (US)

(72) Inventors: Wyatt Thomas Riley, Chesterbrook, PA (US); Carlos Manuel Puig, Santa Clara, CA (US); Joseph Czompo, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1270 days.

(21) Appl. No.: 13/836,452

(22) Filed: Mar. 15, 2013

(65) Prior Publication Data
US 2014/0052401 A1 Feb. 20, 2014

Related U.S. Application Data

(60) Provisional application No. 61/683,622, filed on Aug. 15, 2012, provisional application No. 61/775,371, filed on Mar. 8, 2013.

(51) Int. Cl.
G01P 21/00 (2006.01)
G01R 35/00 (2006.01)
(Continued)

(52) U.S. Cl.
CPC ............ *G01P 21/00* (2013.01); *G01R 35/005* (2013.01); *G06F 1/1694* (2013.01); *G06F 3/016* (2013.01); *G06F 3/038* (2013.01); *G06F 3/0346* (2013.01)

(58) Field of Classification Search
CPC .......... G01P 21/00; G06F 3/016; G06F 3/038; G06F 3/0346; G06F 1/1694; G06F 3/011;
(Continued)

(56) References Cited

U.S. PATENT DOCUMENTS 6,310,605 B1 10/2001 Rosenberg et al.
6,498,996 B1 12/2002 Vallot
(Continued)

FOREIGN PATENT DOCUMENTS

EP 2273484 A1 1/2011
JP 2007251551 A 9/2007
WO 2007004842 A1 1/2007

OTHER PUBLICATIONS

International Search Report and Written Opinion—PCT/US2013/051016—ISA/EPO—dated Oct. 22, 2013.
(Continued)

*Primary Examiner* — An Do
(74) *Attorney, Agent, or Firm* — Hunter Clark PLLC

(57) ABSTRACT

Techniques for compensating for inertial and/or magnetic interference in a mobile device are provided. The mobile device can include a vibration motor to vibrate the device, a processor, and can include an inertial sensor and/or a magnetometer. The processor can be configured to actuate the vibration motor to induce vibration of the mobile device, to measure motion of the mobile device with the inertial sensor of the device to produce sensor output data and/or to measure a magnetic field generated by the vibration motor to produce magnetometer output data, and to compensate for the vibration of the inertial sensor induced by the vibration motor to produce compensated sensor output data and/or to compensate for a magnetic field generated by the vibration motor when the vibration motor is actuated to produce compensated magnetometer output data.

44 Claims, 7 Drawing Sheets

Calibration

(51) Int. Cl.
*G06F 1/16* (2006.01)
*G06F 3/01* (2006.01)
*G06F 3/038* (2013.01)
*G06F 3/0346* (2013.01)

(58) Field of Classification Search
CPC ......... G06F 2203/014; G06F 2203/015; G01R 35/005
USPC .............................................. 702/85, 89–91
See application file for complete search history.

(56) References Cited

U.S. PATENT DOCUMENTS

| | | |
|---|---|---|
| 7,421,343 B2 | 9/2008 | Hawkinson |
| 8,084,968 B2 | 12/2011 | Murray et al. |
| 2002/0101838 A1 | 8/2002 | Tichy et al. |
| 2003/0116101 A1 | 6/2003 | Kim et al. |
| 2005/0192050 A1 | 9/2005 | Son et al. |
| 2006/0229099 A1 | 10/2006 | Chen et al. |
| 2010/0033428 A1 | 2/2010 | Ahn et al. |
| 2011/0230238 A1 | 9/2011 | Aronsson et al. |
| 2012/0013857 A1 | 1/2012 | Yoshikawa et al. |

OTHER PUBLICATIONS

International Preliminary Report on Patentability—PCT/US2013/051016, The International Bureau of WIPO—Geneva, Switzerland, dated Dec. 2, 2014, 33 pgs.

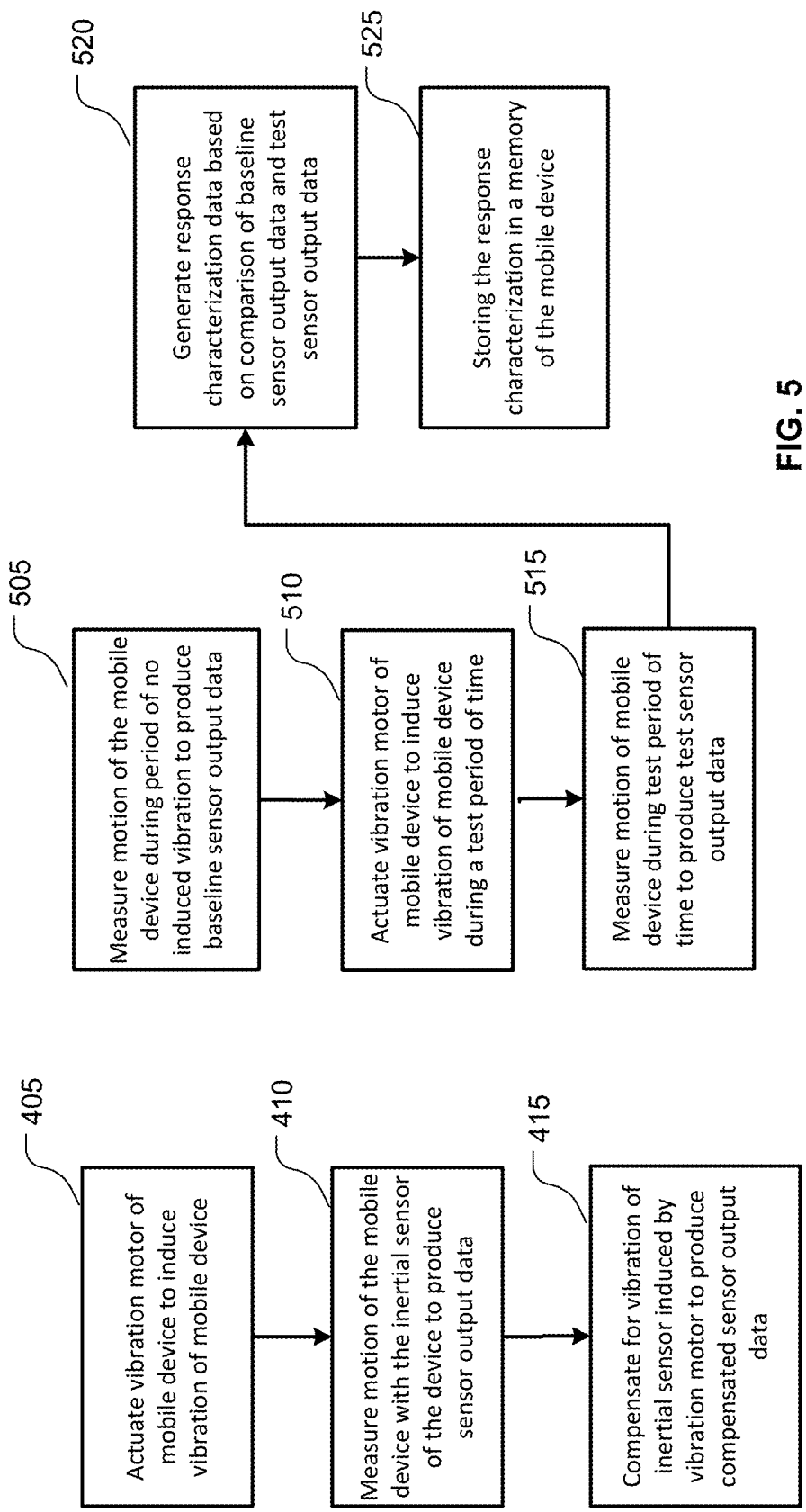

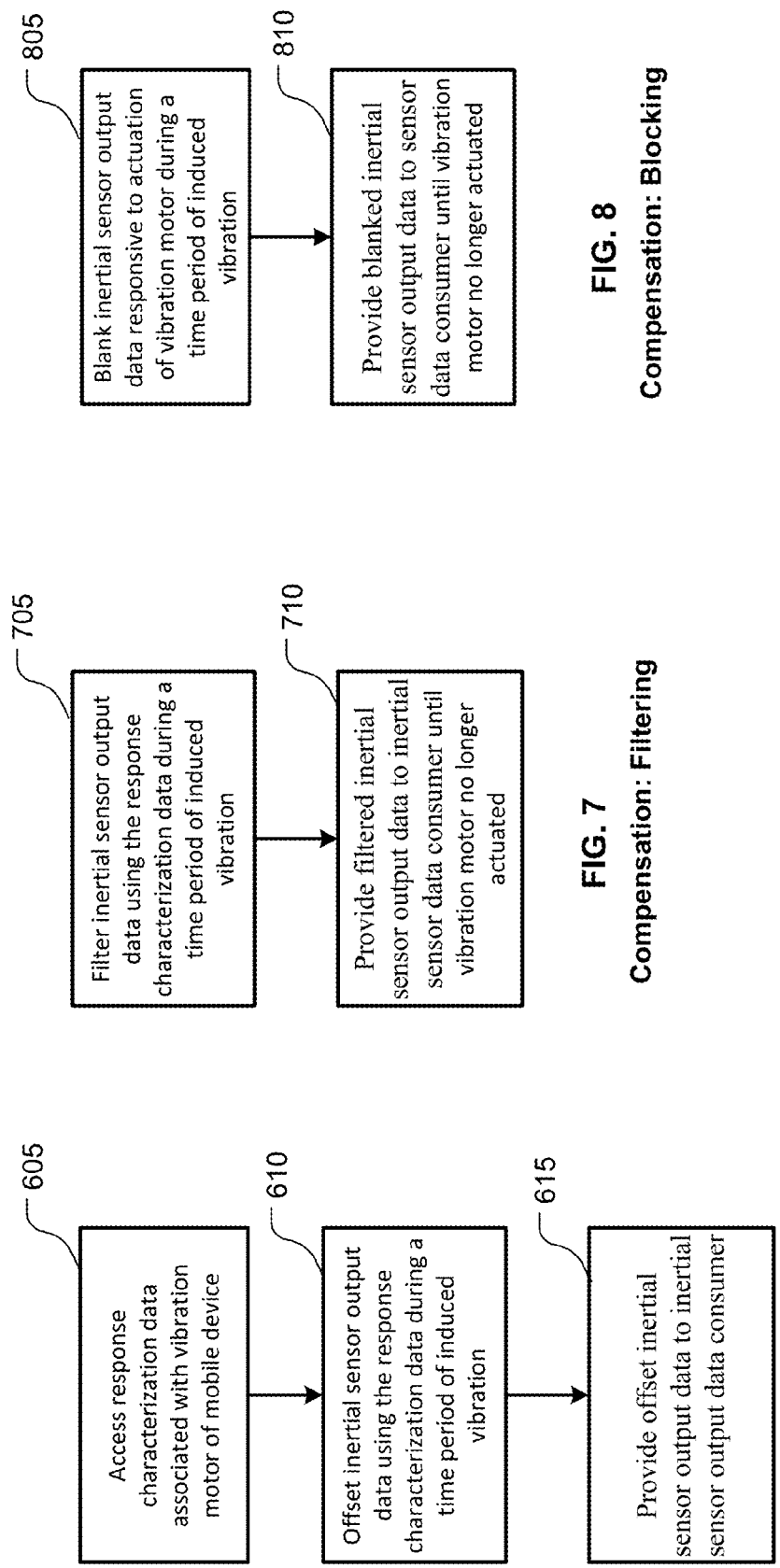

Calibration

Compensation for Magnetic Field

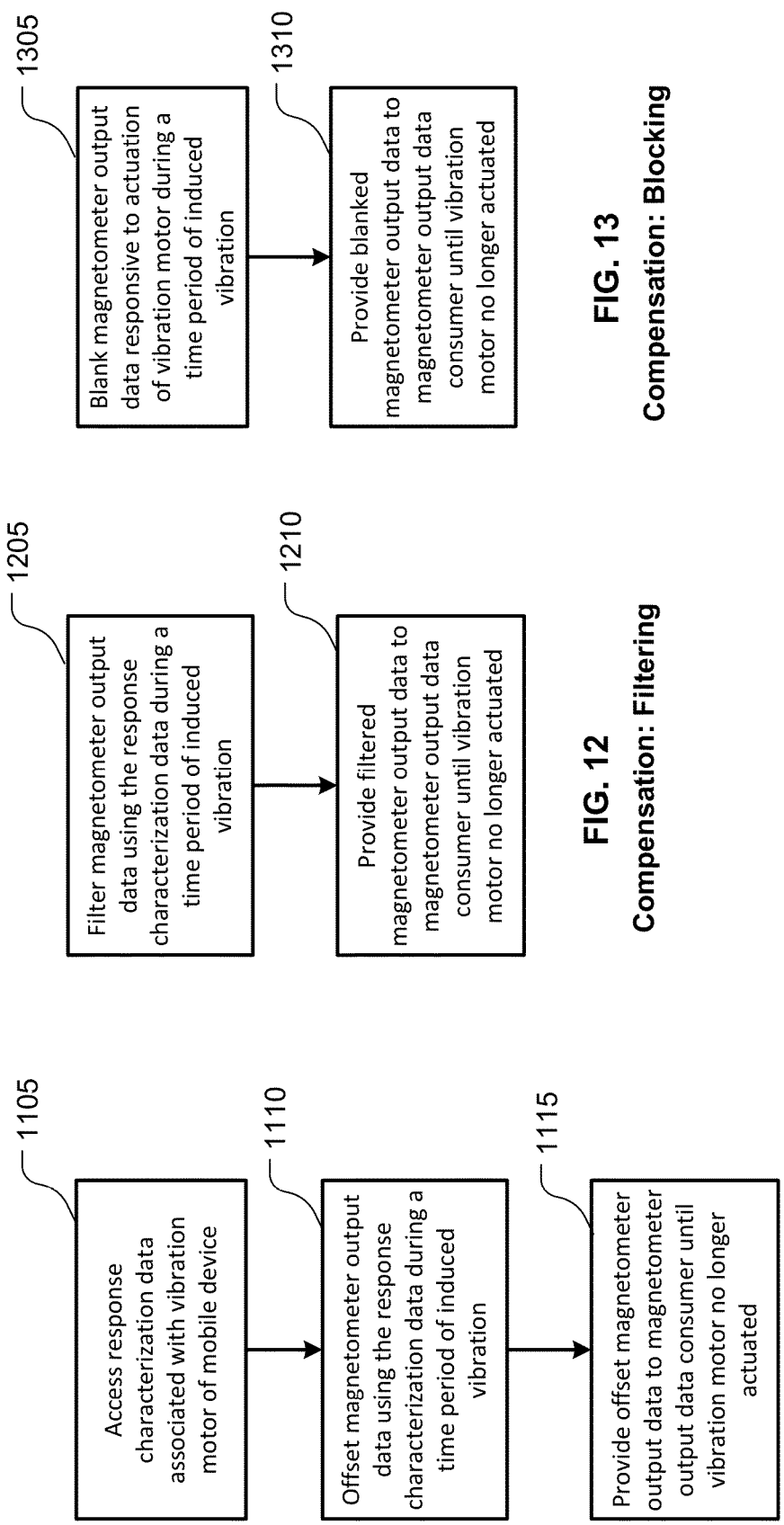

DEVICE DRIVEN INERTIAL INTERFERENCE COMPENSATION

CROSS-REFERENCE TO RELATED APPLICATIONS

This application claims priority to and the benefit of U.S. Provisional Patent Application Ser. No. 61/683, 622, entitled "DEVICE DRIVEN INERTIAL INTERFERENCE COMPENSATION," filed on Aug. 15, 2012, and U.S. Provisional Patent Application Ser. No. 61/775,371 entitled "DEVICE DRIVEN INERTIAL INTERFERENCE COMPENSATION," filed on Mar. 8, 2013, which are assigned to the assignee hereof and incorporated by reference.

BACKGROUND

Wireless communication devices are incredibly widespread in today's society. For example, people use cellular phones, smart phones, personal digital assistants, laptop computers, pagers, tablet computers, etc. to send and receive data wirelessly from countless locations.

Inertial sensors in devices such as phones, tablet computers, etc. are being used for an increasing number of applications including navigation, gesture recognition, and gaming. Many of these devices, e.g., phones, include a vibrate-alert feature to notify a user of events such as incoming calls, incoming texts, calendar events, etc.

SUMMARY

An example mobile device according to the disclosure includes a vibration motor configured to vibrate the mobile device; an inertial sensor configured to sense motion of the mobile device and to provide sensor output data indicative of the motion; and a processor communicatively coupled to the vibration motor and to the inertial sensor. The processor is configured to: actuate the vibration motor to induce vibration of the mobile device; measure motion of the mobile device with the inertial sensor of the device to produce sensor output data; and compensate for the vibration of the inertial sensor induced by the vibration motor, the processor being configured to produce compensated sensor output data based on the sensor output data.

Implementations of such a mobile device may include one or more of the following features. To produce the compensated sensor output data the processor is configured to blank the sensor output data during a time period of the induced vibration. To produce the compensated sensor output data the processor is configured to filter the sensor output data during a time period of the induced vibration. To produce the compensated sensor output data the processor is configured to offset the sensor output data, during a time period of the induced vibration, based on a response characterization of the induced vibration. The processor is configured to generate the response characterization of the induced vibration, the processor being configured to: measure motion of the mobile device during period of no induced vibration to produce baseline sensor output data; actuate vibration motor of mobile device to induce vibration of the mobile device during a test period of time; measure motion of mobile device during test period of time to produce test sensor output data; and generate the response characterization based on comparison of baseline sensor output data and test sensor output data. The processor is further configured to determine a sensor time synchronization based on actuation of the vibration motor. The inertial sensor includes at least one of an accelerometer and a gyroscope. The processor being configured to determine the sensor time synchronization based on actuation of the vibration motor is further configured to determine a timing offset associated with a response time of the inertial sensor by comparing a time at which the vibration motor was actuated with a timestamp associated with the inertial sensor output data. The processor being configured to compensate for the vibration of the inertial sensor induced by the vibration motor is configured to compensate for the vibration of the inertial sensor based at least in part on the timing offset associated with a response time of the inertial sensor. The mobile device includes a second inertial sensor, and the processor is configured to determine a second timing offset associated with the response time of the second inertial sensor. The processor being configured to compensate for the vibration of the inertial sensor induced by the vibration motor is configured to compensate for the vibration of the inertial sensor based at least in part on the timing offset associated with a response time of the inertial sensor and the second timing offset associated with the response time of the second inertial sensor.

An example method according to the disclosure includes actuating a vibration motor of a mobile device to induce vibration of the device; measuring motion of the mobile device with the inertial sensor of the device to produce sensor output data; and compensating for the vibration of the inertial sensor induced by the vibration motor, the compensating including producing compensated sensor output data based on the sensor output data.

Implementations of such a method may include one or more of the following features. The producing the compensated sensor output data includes blanking the sensor output data from the sensor during a time period of the induced vibration to produce the compensated sensor output data. The producing the compensated sensor output data includes filtering the sensor output data from the sensor during a time period of the induced vibration to produce the compensated sensor output data. The producing the compensated sensor output data includes offsetting the sensor output data, during a time period of the induced vibration, based on a response characterization of the induced vibration to produce the compensated sensor output data. Generating the response characterization of the induced vibration, and the generating the response characterization includes: measuring motion of the mobile device during period of no induced vibration to produce baseline sensor output data; actuating vibration motor of mobile device to induce vibration of the mobile device during a test period of time; measuring motion of mobile device during test period of time to produce test sensor output data; and generating the response characterization based on comparison of baseline sensor output data and test sensor output data. Determining a sensor time synchronization based on actuation of the vibration motor. The measuring includes measuring sensor output data from at least one of an accelerometer and a gyroscope. Determining the sensor time synchronization based on actuation of the vibration motor includes determining a timing offset associated with a response time of the inertial sensor by comparing a time at which the vibration motor was actuated with a timestamp associated with the inertial sensor output data. Compensating for the vibration of the inertial sensor induced by the vibration motor includes compensating for the vibration of the inertial sensor based at least in part on the timing offset associated with a response time of the inertial sensor. Determining a second timing offset associated with the response time of a second inertial sensor.

Compensating for the vibration of the inertial sensor induced by the vibration motor includes compensating for the vibration of the inertial sensor based at least in part on the timing offset associated with a response time of the inertial sensor and the second timing offset associated with the response time of the second inertial sensor.

An example mobile device according to the disclosure includes means for actuating a vibration motor of a mobile device to induce vibration of the device; means for measuring motion of the mobile device with an inertial sensor of the mobile device to produce sensor output data; and means for compensating for the vibration of the inertial sensor induced by the vibration motor, the means for compensating for the vibration includes means for producing compensated sensor output data based on the sensor output data Implementations of such a mobile device may include one or more of the following features. The means for producing the compensated sensor output data includes means for blanking the sensor output data during a time period of the induced vibration to produce the compensated sensor output data. The means for producing the compensated sensor output data includes means for filtering the sensor output data during a time period of the induced vibration to produce the compensated sensor output data. The means for producing the compensated sensor output data includes means for offsetting the sensor output data, during a time period of the induced vibration, based on a response characterization of the induced vibration to produce the compensated sensor output data. Means for generating the response characterization of the induced vibration, the means for generating the response characterization including: means for measuring motion of the mobile device during period of no induced vibration to produce baseline sensor output data; means for actuating vibration motor of mobile device to induce vibration of the mobile device during a test period of time; means for measuring motion of mobile device during test period of time to produce test sensor output data; and means for generating the response characterization based on comparison of baseline sensor output data and test sensor output data. Means for determining a sensor time synchronization based on a timing of the induced vibration. The means for measuring includes means for measuring sensor output data from at least one of an accelerometer and a gyroscope. The means for determining the sensor time synchronization based on a timing of the induced vibration includes means for determining a timing offset associated with a response time of the inertial sensor by comparing a time at which the vibration motor was actuated with a timestamp associated with the inertial sensor output data. The means for compensating for the vibration of the inertial sensor induced by the vibration motor includes means for compensating for the vibration of the inertial sensor based at least in part on the timing offset associated with a response time of the inertial sensor. Means for determining a second timing offset associated with the response time of a second inertial sensor. The means for compensating for the vibration of the inertial sensor induced by the vibration motor includes means for compensating for the vibration of the inertial sensor based at least in part on the timing offset associated with a response time of the inertial sensor and the second timing offset associated with the response time of the second inertial sensor.

An example processor-readable medium storing processor-readable instructions according to the disclosure includes processor-readable instructions to cause the processor to: actuate a vibration motor of a mobile device to induce vibration of the mobile device; measure motion of the mobile device with an inertial sensor of the mobile device to produce sensor output data; and compensate for the vibration of the inertial sensor induced by the vibration motor to produce compensated sensor output data based on the sensor output data.

Implementations of such a processor-readable medium may include one or more of the following features. The instructions configured to cause the processor to compensate for the vibration of the inertial sensor induced by the vibration motor to produce the compensated sensor output data based on the sensor output data include instructions configured to cause the processor to compensate for the vibration of the inertial sensor by blanking the motion data during a time period of the induced vibration to produce the compensated sensor output data. The instructions configured to cause the processor to compensate for the vibration of the inertial sensor induced by the vibration motor to produce the compensated sensor output data based on the sensor output data include instructions configured to cause the processor to compensate for the vibration of the inertial sensor by filtering the motion data from the sensor during a time period of the induced vibration to produce the compensated sensor output data. The instructions configured to cause the processor to compensate for the vibration of the inertial sensor induced by the vibration motor to produce the compensated sensor output data based on the sensor output data include instructions configured to cause the processor to compensate for the vibration of the inertial sensor by offsetting the motion data, during a time period of the induced vibration, based on a response characterization of the induced vibration to produce the compensated sensor output data. Instructions configured to cause the processor to generate the response characterization of the induced vibration, the instructions configured to cause the processor to generate the response characterization further including instructions to cause the processor to: measure motion of the mobile device during period of no induced vibration to produce baseline sensor output data; actuate vibration motor of mobile device to induce vibration of the mobile device during a test period of time; measure motion of mobile device during test period of time to produce test sensor output data; and generate the response characterization based on comparison of baseline sensor output data and test sensor output data. Instructions configured to cause the processor to determine a sensor time synchronization based on a timing of the induced vibration. The instructions for causing the processor to measure comprise instructions configured to cause the processor to measure sensor output data from at least one of an accelerometer and a gyroscope. The instructions for causing the processor to determine the sensor time synchronization based on a timing of the induced vibration further include instructions for causing the processor to determine a timing offset associated with a response time of the inertial sensor by comparing a time at which the vibration motor was actuated with a timestamp associated with the inertial sensor output data. The instructions for causing the processor to compensate for the vibration of the inertial sensor induced by the vibration motor further comprise instructions for causing the processor to compensate for the vibration of the inertial sensor based at least in part on the timing offset associated with a response time of the inertial sensor. Instructions for causing the processor to determine a second timing offset associated with the response time of the second inertial sensor associated with the mobile device. The instructions for causing the processor to compensate for the vibration of the inertial sensor induced by the vibration motor further comprise instructions for causing the processor to compensate for the vibration of the inertial sensor based at least in part on the timing offset associated with a response time of the inertial sensor and the second timing offset associated with the response time of the second inertial sensor.

An example mobile device according to the disclosure includes a vibration motor configured to vibrate the mobile device, a magnetometer configured to detect magnet fields affecting the mobile device and to provide magnetometer output data indicative of the magnetic fields, and a processor. The processor being configured to actuate the vibration motor to induce vibration of the mobile device; measure a magnetic field generated by the vibration motor to produce magnetometer output data; and compensate for the magnetic field generated by the vibration motor, the processor being configured to produce compensated magnetometer output data based on the magnetometer output data.

Implementations of such a mobile device may include one or more of the following features. To produce the compensated magnetometer output data the processor is configured to blank the magnetometer output data during a time period of the induced vibration. To produce the compensated magnetometer output data the processor is configured to filter the magnetometer output data during a time period of the induced vibration. To produce the compensated magnetometer output data the processor is configured to offset the magnetometer output data, during a time period of the induced vibration, based on a response characterization of the magnetic field generated by the vibration motor. The processor is configured to generate the response characterization of the magnetic field generated by the vibration motor, the processor being configured to: measure a magnetic field affecting the mobile device during period of no induced vibration to produce baseline magnetometer output data; actuate the vibration motor of mobile device to cause the vibration motor to generate a magnetic field during a test period of time; measure the magnetic field affecting the mobile device during test period of time to produce test magnetometer output data; and generate the response characterization based on comparison of baseline magnetometer output data and test magnetometer output data. The processor is further configured to determine a sensor time synchronization for the magnetometer based on actuation of the vibration motor. The processor being configured to determine the sensor time synchronization for the magnetometer based on actuation of the vibration motor is further configured to determine a timing offset associated with a response time of the magnetometer by comparing a time at which the vibration motor was actuated with a timestamp associated with the magnetometer sensor data. The processor being configured to compensate for the magnetic field generated by the vibration motor is configured to compensate for the for the magnetic field generated by the vibration motor based at least in part on the timing offset associated with a response time of the inertial sensor.

An example method for compensating for the magnetic field generated by a vibration motor of mobile device according to the disclosure includes actuating the vibration motor of the mobile device to induce vibration of the mobile device; measuring a magnetic field generated by the vibration motor to produce magnetometer output data; and compensating for the magnetic field generated by the vibration motor, the processor being configured to produce compensated magnetometer output data based on the magnetometer output data.

Implementations of such a mobile device may include one or more of the following features. The producing the compensated magnetometer output data includes blanking the magnetometer output data from the magnetometer during a time period of the induced vibration. The producing the compensated magnetometer output data includes filtering the magnetometer output data from the magnetometer during a time period of the induced vibration. The producing the compensated magnetometer output data includes offsetting the magnetometer output data, during a time period of the induced vibration, based on a response characterization of the magnetic field generated by the vibration motor. Generating the response characterization of the magnetic field generated by the vibration motor, the generating the response characterization includes: measuring a magnetic field affecting the mobile device during period of no induced vibration to produce baseline magnetometer output data; actuating the vibration motor of mobile device to cause the vibration motor to generate a magnetic field during a test period of time; measuring the magnetic field affecting the mobile device during test period of time to produce test magnetometer output data; and generating the response characterization based on comparison of baseline magnetometer output data and test magnetometer output data. Determining a sensor time synchronization based on actuation of the vibration motor. Determining the sensor time synchronization based on actuation of the vibration motor includes determining a timing offset associated with a response time of the magnetometer by comparing a time at which the vibration motor was actuated with a timestamp associated with the magnetometer output data. Compensating for the magnetic field generated by the vibration motor includes compensating for the magnetic field generated by the vibration motor based at least in part on the timing offset associated with a response time of the magnetometer.

An example mobile device according to the disclosure includes means for actuating a vibration motor of the mobile device to induce vibration of the device; means for measuring a magnetic field generated by the vibration motor to produce magnetometer output data; and means for compensating for the magnetic field generated by the vibration motor, the processor being configured to produce compensated magnetometer output data based on the magnetometer output data.

Implementations of such a mobile device may include one or more of the following features. The means for compensating include means for blanking the magnetometer output data during a time period of the induced vibration to produce the compensated magnetometer output data. The means for compensating include means for filtering the magnetometer output data during a time period of the induced vibration to produce the compensated magnetometer output data. The means for compensating include means for offsetting the magnetometer output data, during a time period of the induced vibration, based on a response characterization of the magnetic field generated by the vibration motor to produce the compensated magnetometer output data. Means for generating the response characterization of the magnetic field generated by the vibration motor, the means for generating the response characterization including: means for measuring a magnetic field affecting the mobile device during period of no induced vibration to produce baseline magnetometer output data; means for actuating the vibration motor of mobile device to cause the vibration motor to generate a magnetic field during a test period of time; means for measuring the magnetic field affecting the mobile device during test period of time to produce test magnetometer output data; and means for generating the response characterization based on comparison of baseline magnetometer output data and test magnetometer output data. Means for determining a sensor time synchronization based on a timing of the induced vibration. Means for determining the sensor time synchronization based on a timing of the induced vibration includes means for determining a timing offset associated with a response time of the magnetometer by comparing a time at which the vibration motor was actuated with a timestamp associated with the magnetometer output data. Means for compensating for the magnetic field generated by the vibration motor includes means for compensating for the magnetic field generated by the vibration motor based at least in part on the timing offset associated with a response time of the magnetometer.

Implementations of a processor-readable medium storing processor-readable instructions according to the disclosure includes instructions configured to cause the processor to actuate a vibration motor of a mobile device to induce vibration of the mobile device; measure a magnetic field generated by the vibration motor to produce magnetometer output data; and compensate for the magnetic field generated by the vibration motor, the processor being configured to produce compensated magnetometer output data based on the magnetometer output data.

Implementations of such a processor-readable medium storing processor-readable instructions may include one or more of the following features. The instructions are configured to cause the processor to compensate for the magnetic field generated by the vibration motor by blanking the magnetometer output data during a time period of the induced vibration to produce the compensated magnetometer output data. The instructions are configured to cause the processor to compensate for the magnetic field generated by the vibration motor by filtering the magnetometer output data during a time period of the induced vibration to produce the compensated magnetometer output data. The instructions are configured to cause the processor to compensate for the magnetic field generated by the vibration motor by offsetting the magnetometer output data, during a time period of the induced vibration, based on a response characterization of the magnetic field generated by the vibration motor of the mobile device to produce the compensated magnetometer output data. Instructions configured to cause the processor to generate the response characterization of the magnetic field generated by the vibration motor, the instructions configured to cause the processor to generate the response characterization further comprising instructions to cause the processor to: measure a magnetic field affecting the mobile device during period of no induced vibration to produce baseline magnetometer output data; actuate the vibration motor of mobile device to cause the vibration motor to generate a magnetic field during a test period of time; measure the magnetic field affecting the mobile device during test period of time to produce test magnetometer output data; and generate the response characterization based on comparison of baseline magnetometer output data and test magnetometer output data. Instructions configured to cause the processor to determine a sensor time synchronization based on a timing of the induced vibration. The instructions for causing the processor to determine the sensor time synchronization based on a timing of the induced vibration include instructions for causing the processor to determine a timing offset associated with a response time of the magnetometer by comparing a time at which the vibration motor was actuated with a timestamp associated with the magnetometer output data. The instructions for causing the processor to compensate for the magnetic field generated by the vibration motor include instructions for causing the processor to compensate for the magnetic field generated by the vibration motor based at least in part on the timing offset associated with a response time of the magnetometer.

Items and/or techniques described herein may provide one or more of the following capabilities, as well as other capabilities not mentioned.

BRIEF DESCRIPTION OF THE DRAWINGS

FIG. 4 is a block flow diagram of an example process for compensating for device driven inertial interference.

FIG. 5 is a block flow diagram of an example process for determining a response characterization of an induced vibration of a mobile device.

FIG. 6 is block flow diagram of an example process for compensating for the vibration of the inertial sensor of the mobile device by offsetting inertial sensor output data based on response characterization data of the induced vibration.

FIG. 7 is a block flow diagram of an example process for compensating for the vibration of the inertial sensor of a mobile device by filtering inertial sensor output data during a time period of induced vibrations of the mobile device.

FIG. 8 is a block flow diagram of an example process for compensating for the vibration of the inertial sensor of a mobile device by blocking inertial sensor output data during a time period of induced vibrations of the mobile device.

FIG. 11 is block flow diagram of an example process for compensating for the magnetic field generated by the vibration motor of the mobile device by offsetting magnetometer output data based on response characterization data of an induced vibration of the mobile device.

FIG. 12 is a block flow diagram of an example process for compensating for the magnetic field generated by the vibration motor of a mobile device by filtering magnetometer output data during a time period of induced vibrations of the mobile device.

FIG. 13 is a block flow diagram of an example process for compensating for the magnetic field generated by the vibration motor of a mobile device by blocking or blanking out magnetometer data during a time period during which the vibration motor is actuated.

DETAILED DESCRIPTION

Techniques for compensating for inertial interference in a mobile device are provided. Vibrations produced by vibration-alert components can be a significant source of noise for other components of a mobile device that includes a vibration-alert component. The noise produced by the vibration-alert component can corrupt measurements of inertial sensors, such as accelerometers and gyroscopes, of broader externally-driven motion experienced by the sensors, such as movement of the user carrying or using the mobile device containing the sensors or movements of a user of the mobile device.

Data collected by inertial sensors can be used by applications on the mobile device, such as navigation applications, games, and other applications that are configured to receive inertial sensor output data. Applications such as these can rely on inertial sensor output data to measure movements of the user of the mobile device, to determine the orientation of the mobile device, to determine whether the mobile device is stationary or moving, and/or to make other determinations regarding the position and movement of the mobile device. The vibrations caused by a vibration alert can interfere with the algorithms used to process the inertial sensor output data, which can result in the algorithms producing erroneous results and adversely affect the behavior of the applications using the results of these algorithms.

Techniques are provided herein for reducing effects of vibration from a vibrate-alert feature of a device. For example, sensor output data can be suppressed during vibration from a vibrate-alert feature, e.g., by ignoring or filtering the sensor output data. Sensor data resulting from the vibration can be characterized and the characterized data used to offset sensor output data. Other techniques can also be employed.

Items and/or techniques described herein may provide one or more of the following capabilities, as well as other capabilities not mentioned. The effects of vibration from a vibration-alert device on inertial sensors may be reduced. Cleaner, more usable inertial sensor signals may be provided, yielding improved navigation results from use of the inertial sensor signals, such as improved navigation, gesture recognition, and/or gaming experiences.

Figure 1:
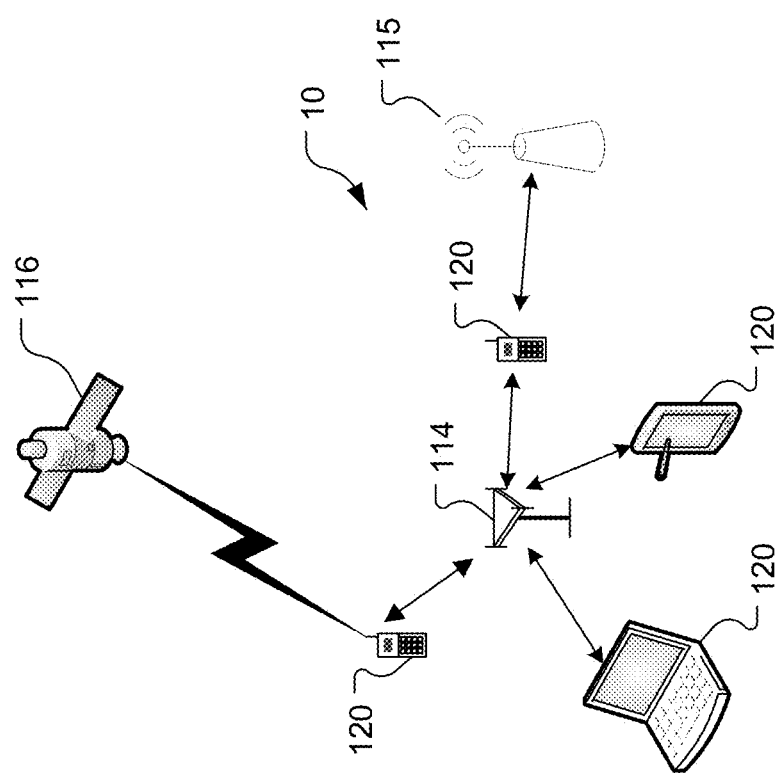
FIG. 1 is a schematic diagram of a wireless telecommunication system.
Figure 2:
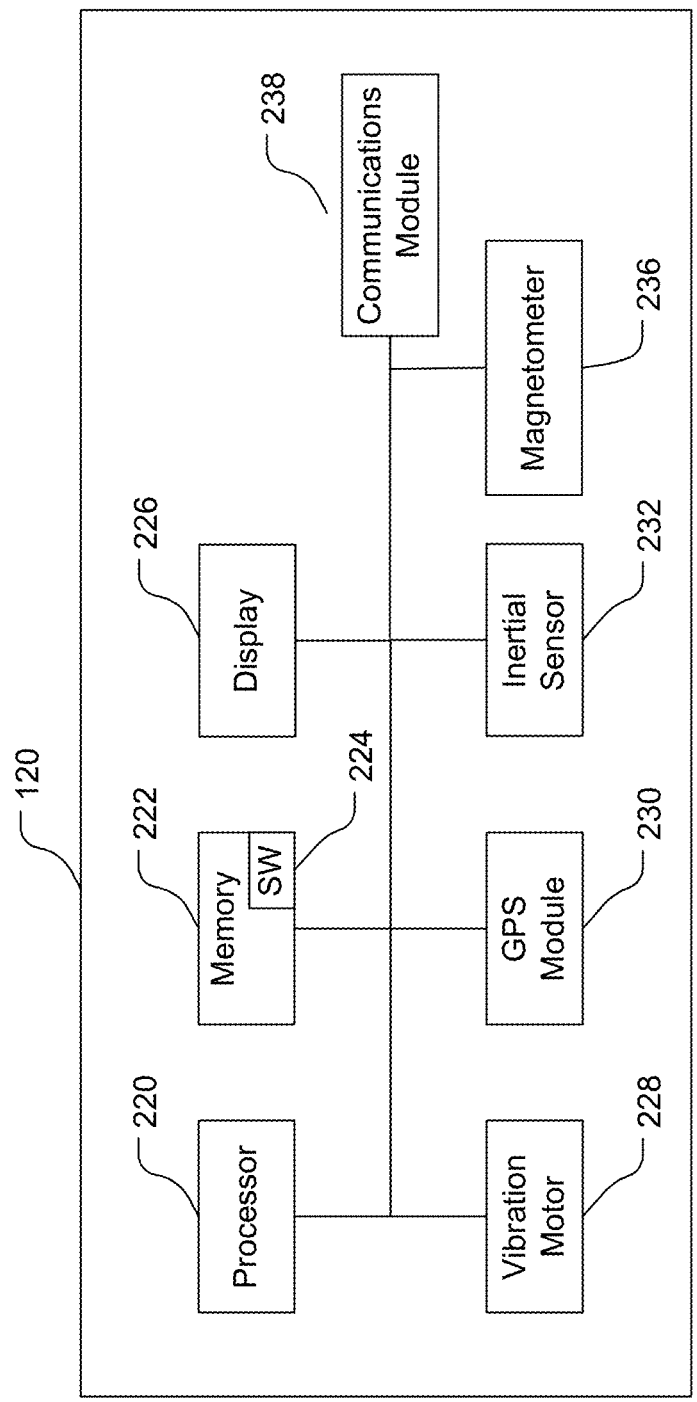
FIG. 2 is a block diagram of components of mobile device shown in FIG. 1.
Figure 3:
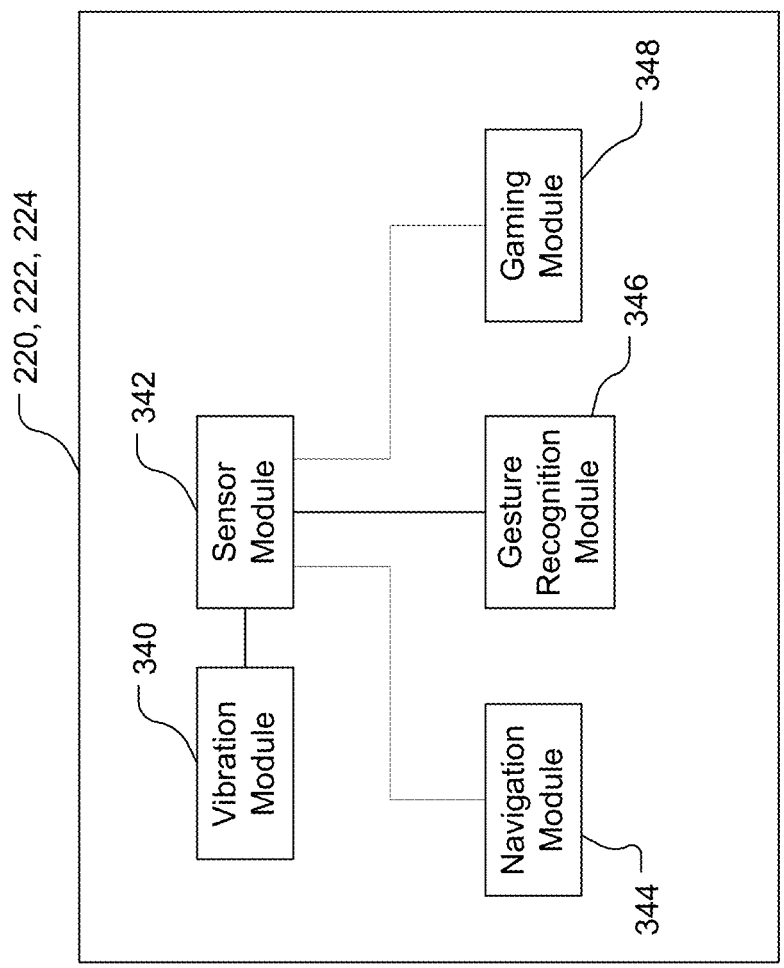
FIG. 3 is a combined functional-block diagram of the mobile device shown in FIG. 2.

Referring to FIG. 1, a wireless communication system 10 includes mobile devices 120, a base transceiver station (BTS) 114, a wireless access point (WAP) 115, and a navigation satellite 116. The system 10 is a communication system in which communications can be sent between devices, e.g., bi-directionally between the BTS 114 and the mobile devices 120, bi-directionally between the WAP 115 and the mobile devices 120, and possibly between the mobile devices 120, and unidirectionally from the satellite 16 to the mobile devices 120 (although only one such communication is depicted in FIG. 1). The mobile devices 120 can comprise mobile phones, personal digital assistants, tablet computers, laptops and/or other types of portable devices. An example of a mobile device 120 is illustrated in FIGS. 2 and 3 and is described in detail below.

The example wireless communication system 10 illustrated in FIG. 1 includes a single WAP 115, but other network environments that can be used to implement the techniques disclosed herein may include more wireless access points. The wireless access points may be distributed throughout an indoor and/or outdoor environment and may be placed on different floors within the indoor environment. The term "access point" is used for simplicity, but refers to communication devices, more generally, one example of which include access points in wireless local area networks, such as IEEE 802 series compliant networks including the IEEE 802.11 family of standards commonly referred to as Wi-Fi. For example, devices that use Bluetooth can be communication devices according to the disclosure. As such, the usage of the term access point is not exclusive of other kinds of communication networks. Furthermore, a wireless access point 115 can be configured to implement other wireless communications standards in addition or instead of standards from the IEEE 802 series. A wireless access point 115 can either be located at a fixed location or may be mobile. For example, a wireless access point 115 can be a mobile device that is configured to provide a WiFi hotspot and is configured to wirelessly connect to a mobile communication network, e.g. a WAN to provide network connectivity to the WiFi hotspot.

The example wireless communication system 10 illustrated in FIG. 1 includes a single BTS 114, but other network environments that can be used to implement the techniques disclosed herein may include more wireless access points. The base station 114 can be configured to wirelessly communicate with a plurality of mobile devices, such as mobile devices 120. The base station 114 may be located within an indoor and/or environment and/or may provide a coverage area that overlaps with at least a portion of the coverage areas of one or more WAPs and/or other base stations (not shown). The base station 114 can be associated with a mobile communications network provider and can be configured to communication using one or more wireless communications protocols for mobile devices. For example, the base station 114 can be configured to use on more of the wireless communications protocols, such as Code Division Multiple Access (CDMA), Time Division Multiple Access (TDMA), Frequency Division Multiple Access (FDMA), Orthogonal FDMA (OFDMA), and Single-Carrier FDMA (SC-FDMA), Long Term Evolution (LTE), and/or other wireless communications protocols. For example, the base station 114 can be an evolved Node B (eNB) in a wireless communication system implanting the LTE wireless communications standards. The wireless communications discussed herein are only examples of some of the types of wireless protocols that may be implemented by the base station 114, and are not intended to limit the techniques discussed herein to wireless communication networks using these protocols.

The BTS 114 can be implemented as a femtocell base station or picocell base station that is configured to provide wireless connectivity for a mobile communications network. Femtocell base stations and picocell base stations typically provide a smaller coverage area than that provided by a conventional BTS 114. For example, a picocell might provide wireless network access for a building, such as an office building, train station, or shopping mall, and a femtocell might provide access to for a single home or business.

Referring also to FIG. 2, an exemplary one of the mobile devices 120 comprises a computer system including a processor 220, memory 222 including software 224, a display 226, a vibration motor 228, a satellite positioning system module, here a Global Positioning System (GPS) module 230, and inertial sensors 232. While multiple inertial sensors 232 are indicated in FIG. 2, the techniques discussed herein need not be applied to multiple sensors or data from multiple sensors. The processor 220 is preferably an intelligent hardware device, e.g., a central processing unit (CPU) such as those made by ARM®, Intel® Corporation, or AMD®, a microcontroller, an application specific integrated circuit (ASIC), etc. The processor 220 can comprise multiple separate physical entities that can be distributed in the mobile device 120. The memory 222 includes non-transitory storage such as random access memory (RAM) and read-only memory (ROM). The memory 222 stores the software 224 which is computer-readable, computer-executable software code containing instructions that are configured to, when executed, cause the processor 220 to perform various functions described herein. Alternatively, the software 224 may not be directly executable by the processor 220 but is configured to cause the computer, e.g., when compiled and executed, to perform the functions. The description herein may refer to the processor performing one or more functions as shorthand for the processor 220 executing instructions to perform the one or more functions.

The display 226 can be used to display visual content to a user of the mobile device. The display 226 of the mobile device 120 can be a 2D display or can be a 3D display capable of displaying stereoscopic images. The mobile device 120 can be configured to render 2D and/or 3D content depending upon the capabilities of the display 226 and the configuration of the mobile device 120.

The display 226 can be a touch screen interface that includes touch sensor (not shown). The processor 220 can be configured to generate graphical data for display on display 226. Applications on the mobile station 120 and/or various modules, such as the operating system and/or the functional modules illustrated in FIGS. 2 and 3, can be implemented in software and/or hardware and can be configured to send commands to the processor 220 to display image or video content on the display 226. The processor 220 can process data output by the touch sensor to identify when a user touches the touch screen. The processor 220 can be configured to identify various touch gestures, including multi-finger touches of the touch screen. The operating system, applications, and/or the positioning engine can use the gesture information determined by the processor 220 to determine, at least in part, receive and respond to user input.

The GPS module 230 includes appropriate equipment for monitoring GPS signals from satellites (although only the one satellite 116 is shown in FIG. 1) and, in conjunction with the processor 220, for determining position of the mobile device 120. While the example implementation illustrated in FIG. 2 includes system for monitoring signals from a GPS system, the mobile device 120 can be configured to include a satellite positioning system module configured to monitor signals from satellites belonging to one or more Satellite Positioning Systems (SPSs), including, but not limited to, the GPS system, the GLONASS system, the Galileo system, and/or other SPSs.

The communications module 238 can be configured to allow the device to send and receive data from nearby wireless devices, including wireless access point 115, the base station 114, and other mobile devices 120. The communications module 238 can be configured to enable the mobile device 120 to communicate either directly or indirectly with the wireless access points 115, the base station 114, and/or other mobile devices 120. The communications module 238 can include receivers, transmitters, antennas, and other components that enable the mobile device 120 to communication wirelessly with other wireless communication devices. The communications module 238 can be configured to send and/or receive data using one or more wireless communications protocols, including those described above with respect to the wireless access points 115 and the base station 114. The communications module 238 can also be configured to provide one or more interfaces for wired connectivity that can allow the mobile device 120 to send and/or receive data through a wired network connection.

The vibration motor 228 is configured to vibrate the mobile device 120. For example, the motor 228 can induce physical oscillating movement to provide an alert to the user of the mobile device in response to an event that may require the attention of the user of the mobile device. The motor 228 can be actuated by the processor 220 to call a user's attention to any of a variety items. For example, the processor 220 can be configured to actuate the vibration motor 228 in response to the mobile device 120 receiving an incoming call, an incoming text message, a calendar event, a navigation event, or other event.

The inertial sensors 232 are configured to measure movement of the mobile device 120. The mobile device 120 can include one or more inertial sensors 232 and can include more than one type of inertial sensor. Each of the inertial sensors 232 may be of any of a variety of types of sensors, such as an accelerometer or a gyroscope. The inertial sensors 232 can be configured to measure motion of the mobile device 120 regardless of the cause. Thus, the inertial sensors 232 will measure and provide output data regarding motion induced by external forces such as a user carrying, holding, dropping, etc. the mobile device 120. The inertial sensors 232 can also be configured to detect motion due to internal forces such as the vibration motor 228. The inertial sensors 232 can be configured to provide data to the sensor module 342. The inertial sensors 232 can collect data that can be used to determine the position, orientation, and movement of the mobile device 120.

The data collected from the inertial sensors 232 can be used by applications on the mobile device that can translate the sensor data to inputs usable by the mobile device. For example, a game application or other application on the mobile device 120 can be configured to receive input from the user based on gestures and/or movements of the mobile device. In another example, a navigation application can be configured to use position, movement, and orientation information to provide the user of the mobile device 120 with navigation instruction and/or information associated with the position of the mobile device 120.

The mobile device 120 can also include one or more magnetometers 236 that can be used to measure the Earth's magnetic field and/or other magnetic fields affecting the mobile device 120 and to output magnetometer output data that can be used by one or more applications that can translate the magnetometer output data into inputs usable by the mobile device. For example, the mobile device 120 may include a compass application and/or a navigation application that use the magnetometer output data to determine a heading of the mobile device 120.

Referring also to FIG. 3, the processor 220 and the memory 222, including the software 224, are configured to implement a vibration module 340, a sensor module 342, a navigation module 344, a gesture recognition module 346, and a gaming module 348. That is, the memory 222 is storage that stores software code that when executed directly or indirectly (e.g., after compiling) by the processor 220 implements the modules 340, 342, 344, 346, 348. A mobile device 120 may include one or all of the navigation module 344, gesture recognition module 346, and the gaming module 348. The modules 340, 342, 344, 346, 348 are examples of modules that a mobile device 120 can include. However, implementations of a mobile device 120 can also include one or more additional modules not described herein, and some implementations may not include one or more of the mobile described herein.

Navigation module 344 is configured to provide navigation information to the user of the mobile device 120 and can be configured to display map information, route information, and other navigational aids on the display 226 of the mobile device 120. The navigation module 344 can be configured to receive data from the GPS module 230 that can be used to determine the position of the mobile device 120. The navigation module 344 can also be configured use signal information from the communications module 238 from one or more base stations 114 and/or wireless access points 115.

For example, the navigation module 344 can be configured to perform trilateration using signal measurements (e.g., RSSI (received signal strength indication), RTT (round-trip time)), time of arrival (TOA), and/or disambiguate between multiple possible disambiguation regions (e.g., floors) within an indoor environment, e.g., using RSSI and/or RTT measurements and known locations of the wireless access points 115 and/or wireless base stations 140. The navigation module 344 can also be configured to determine the position of the mobile device 120 using signals received from the GPS module 230 to determine the position of the mobile device 120 when outdoors and a line of site to a sufficient number of satellites from one or more SPS constellations. The navigation module 344 can also be configured to use magnetometer sensor data obtained from the magnetometer 236 to determine a heading for the mobile device 120. The navigation module 344 can be configured to use the magnetometer output data in conjunction with data from the GPS module 230 and/or signals obtained from one or more base stations 114 and/or wireless access points 115 to determine the position of the mobile device 120 and/or a heading of the mobile device 120.

Gesture recognition module 346 can be configured to receive information from the inertial sensors via the sensor module 342 and/or from other input sources, such as a touch sensor. The gesture recognition module 346 can be configured to recognize various gestures and to convert those gestures to control signals that can be provided to the control aspects of the operating system of the mobile device 120 and/or to one or more applications or modules running on the mobile device, such as modules 340, 342, 344, and 348.

Gaming module 348 can be configured to receive user inputs via the inertial sensors 232 in addition to other user interface devices, such as the touch sensor, a keyboard, joystick, etc. and to provide the user input information to one or more game applications running on the mobile device. In some implementations, the gaming module 348 can be implemented as part of a game application implemented on the mobile device 120, and in other implementations the gaming module 348 may be implemented as part of the operating system of the mobile device 120. The gaming module 348 can also be configured to include one or more game applications playable on the mobile device 120.

The vibration module 340 can be configured to actuate the vibration motor 228 to responsive to a vibration alert event. The vibration alert event can be triggered by one or more applications or software modules on the mobile device 120. The vibration module 340 can also be configured to trigger the vibration motor 228 in response to a signal from one or more one or more applications or software modules on the mobile device 120 in order to provide haptic feedback to a user of the mobile device 120.

The vibration module 340 can be configured to actuate the vibration motor 228, to characterize the response to the vibrations from the motor 228, and to store the response characterization. The response characterization can be determined once, e.g., during manufacture of the mobile device 120, or more than once, e.g., during manufacture and/or periodically after manufacture is complete. The vibration module 340 can be configured to characterize multiple patterns of vibration as appropriate, e.g., for different alerts. The response characterization data can be based on the sensor output data from the inertial sensors 232 and can be used to develop a model of the effects of the vibration patterns on the inertial sensors 232 that can be used to compensate for the vibrations induced by vibration alerts. The vibration module 340 can be configured to store the response characterization in the memory 222 of the mobile device 120 or another non-transitory, computer-readable storage medium. The vibration module 340 can be configured to access the response characterization data stored in the memory 222 of the mobile device 120 or the other non-transitory, computer-readable storage medium. The vibration module 340 can also be configured to characterize the response of the magnetometer to the magnetic field generated by the vibration motor 228 when the vibration motor 228 is actuated. The effect may vary based on the vibration pattern and the vibration module 340 can be configured to response characterization information for the magnetometer 236 for each of these patterns. The vibration module 340 can be configured to store the response characterizations associated with the magnetometer 236 in the memory 222. Accordingly, the response characterization data may include characterizations associated with the effects of the vibration motor 228 on the inertial sensors 232 and/or the magnetometer 236.

The vibration module 340 can also be configured to receive and analyze sensor output data from the inertial sensors 232 and the magnetometer 236 via the sensor module 342. For example, the vibration module 340 can initiate vibration of the vibration motor 228, and analyze sensor output data from the sensor module 342 to test and/or confirm sensor time synchronization with the processor 220 by analyzing a time indicated by the sensor data with a time that the vibration module 340 initiated the vibration motor 228. Further, using these data, relative time synchronization between the inertial sensors 232, e.g., between an accelerometer and a gyroscopic sensor in the same device, can also be determined. The vibration module 340 can also be configured to determine a relative time synchronization between the inertial sensors 232 and the magnetometer 236.

The vibration module 340 can be configured to synchronize the sensor data output from the inertial sensors 232 by detecting a vibration event that occurred over a known time period. The sensor data output from the inertial sensors 232 can be associated with a timestamp, and the vibration module 340 can be configured to compare the timestamps associated with the sensor data output from the inertial sensors 232 and/or the magnetometer sensor output from the magnetometer 236 with known times associated with the vibration event. The vibration module can use the results of this comparison to identify a time offset between the sensor data output from the inertial sensors and/or the magnetometer sensor output from the magnetometer 236 and the known times associated with the vibration event. For example, the vibration module 232 can be configured to compare a known start and/or end time for the vibration event with the timestamps associated with the sensor data output of the inertial sensors 232 and/or the magnetometer sensor output from the magnetometer 236 to determine any time offsets associated with the signal data output from each of the inertial sensors 232 and/or the magnetometer sensor output from the magnetometer 236. The vibration module 232 can use this timing offset information when compensating for a vibration of the mobile device 120 caused by the vibration alert, because the timing difference between the vibration alert starting and/or ending and the sensor output data for the inertial sensors 232 and/or the magnetometer sensor output for the magnetometer 236 reflecting the start and/or end of the vibration alert is known.

In implementation of the mobile device 120 that include multiple inertial sensors, the vibration module 232 can be configured to determine a timing offset for each of the inertial sensors 232 in order to synchronize the sensor data output from each of the inertial sensors 232. For example, a mobile device 120 could include two inertial sensors, such as an accelerometer and a gyroscope, two gyroscopes, two accelerometers, or the mobile device could include a combination of more than two inertial sensors that includes some combination of accelerometers, gyroscopes, and/or other types of inertial sensors. The vibration module 340 can be configured to determine the timing offsets for each of the inertial sensors 232 by applying the same vibration wave form associated with a vibration alert to the mobile device 120 multiple times and measuring the sensor data output from each of the inertial sensors 232. In other implementations, the vibration module can be configured to concurrently measure the sensor data output from the inertial sensors 232 while applying a vibration waveform associated with a vibration alert to the mobile device 120. The vibration module 232 can use the timing offset information for each of the inertial sensors 232 when compensating for a vibration of the mobile device 120 caused by the vibration alert, because the timing difference between the vibration alert starting and/or ending and the sensor output data for each of the inertial sensors 232 reflecting the start and/or end of the vibration alert is known based on the testing discussed above. The vibration module 340 can be configured to develop these timing offsets to synchronize the sensor data output from the inertial sensors 232 during a calibration procedure. For example, the timing offsets could be determined as part of the calibration process illustrated in FIG. 5. The vibration module 340 can also be configured to determine timing offsets with respect to the magnetometer output data output from the magnetometer 236 and the one or more inertial sensors 232 using the techniques discussed above with respect to determining the timing offsets for implementations of the mobile device 120 that include multiple inertial sensors 232.

The sensor module 342 is configured to receive sensor output data from the inertial sensors 232 and the magnetometer 236, and process and provide these data as appropriate. The sensor module 342 can provide the sensor output data and/or magnetometer output data unmodified to the vibration module 340, the navigation module 344, the gesture recognition module 346, the gaming module 348 and/or other modules associated with the mobile device. For example, the sensor module 342 can provide the unmodified sensor output data to the modules 344, 346, 348 in the absence of vibration from the vibration motor 228. Further, the sensor module 342 may provide the unmodified sensor output data from the inertial sensors 232 and the magnetometer output data from the magnetometer 236 to the vibration module 340 in the presence of vibration from the vibration motor, e.g., to determine the time synchronization discussed above and to compensate for the effects of the vibration of the mobile device 120 on the inertial sensors 232 and/or for the effects of the magnetic field generated by the vibration motor 228 on the magnetometer 236.

The sensor module 342, alone or in combination with the vibration module 340, is further configured to provide a compensating means to compensate for the vibration to produce compensated sensor output data in accordance with indications from the vibration module 340 and to provide the compensated sensor output data to the modules 344, 346, 348. The sensor module 342 can also include compensating means to compensate for the magnetic field produced by the vibration motor and to produce compensated magnetometer output data. For example, the vibration module 340 can cause the sensor module 342 to suppress the sensor output data from the inertial sensors 232 and/or the magnetometer data output from the magnetometer 236 during vibration of the motor 228. To suppress the sensor output data and/or the magnetometer data output, the vibration module 340 can be configured to cause the sensor module 342 to blank (block), offset, and/or filter the sensor output data and/or the magnetometer data output. For example, the sensor output data from the inertial sensors 232 and/or the magnetometer data output from the magnetometer 236 can be blanked/ignored during times when the inertial sensors 232 are subject to vibration from the motor 228. The vibration module 340 can also be configured to cause the sensor module 342 to filter the sensor data output to suppress known characteristics of the vibration such as a certain frequency null, and the vibration module 340 can also be configured to cause the sensor module 342 to filter the magnetometer data output to suppress certain known characteristics of the magnetic field generated by the vibration motor 228 when the motor is actuated. Further, the vibration module 340 can cause the sensor module 342 to offset the sensor output data and/or the magnetometer output data by using the stored response characterization of the vibration of the motor 228 and/or of the magnetic field generated by actuation of the motor. Also or alternatively, some or all of the sensor data can be offset before being output by the inertial sensors 232. The vibration module 340 can be configured to synchronize the compensation with the timing of the vibration of the motor 228 by actuating the motor 228 and causing the compensation by the sensor module 342 relative to each other in time so that the vibration effects and/or magnetic field effects caused by actuation of the vibration motor 228 are compensated.

FIG. 4 is a block flow diagram of an example process for compensating for device driven inertial interference. The process illustrated in FIG. 4 can be implemented by the mobile device 120 illustrated in FIG. 2 and FIG. 3.

The vibration motor 228 of mobile device 120 can be actuated to induce vibration of the mobile device 120 (stage 405). The mobile device 120 can be configured to include a vibration-alert feature that can be used to alert the user of a mobile device to an event, such as an incoming call, an incoming text message, a calendar event, a navigation event, or other event that may require the attention of the user of the mobile device 120. The vibration module 340 of the mobile device 120 can be configured to actuate the vibration motor 228 of the mobile device 120 in response to a notification of an event from the operating system or an application running on the mobile device. The operating system and/or applications can be implemented in the software 224 stored in the memory 222 of the mobile device 120 or in another computer-readable memory associated with the mobile device. For example, the software can be stored on a removable media module, such as a flash drive, a Secure Digital (SD) card, or other type of non-volatile computer-readable memory card. The vibration module 340 can be configured to actuate the vibration motor 228 of the mobile device to induce the vibration motor 228 to produce vibrations having different patterns and/or duration for different alerts.

The motion of the mobile device can then be measured with the inertial sensors 232 to produce sensor data output (stage 410). The actuation of the vibration motor 228 induces the mobile device 120 to vibrate, and this vibration introduces noise into the signal data produced by the inertial sensors 232. Accordingly, if the mobile device 120 were to provide the sensor output data directly to one or more inertial sensor output data consumers, the use of the sensor output data by the inertial sensor output data consumers may cause erroneous results in the inertial sensor output data processing algorithms used by the consumers of this data. As a result, navigational application, games, gesture recognition applications, and/or other consumers of the inertial sensor output data could produce poor results while the vibration motor 228 is actuated, which can negatively impact the user experience for users of the mobile device 120.

Vibration of inertial sensor of mobile device induced by vibration motor can then be compensated for to produce compensated sensor output data (stage 415). The vibration module 340 of the mobile device can be configured to receive sensor output data from the inertial sensors 232 and to generate compensated sensor output data that can reduce or eliminate the effects of the vibration of the mobile device 120 that can introduce noise into the sensor data output of the inertial sensors 232. Some examples of techniques for generating compensated sensor output data are provided in the processes illustrated in FIGS. 5-8.

The compensated sensor output data can then be provided to one or more consumers of inertial sensor output data. The compensated sensor output data includes sensor data that can reduce or eliminate the effects of the vibration of the mobile device 120 and may provide a better user experience for users of the mobile device 120.

FIG. 5 is a block flow diagram of an example process for determining a response characterization of an induced vibration of a mobile device. The process illustrated in FIG. 5 can be implemented at the time that the mobile device 120 is produced and/or can be implemented periodically to determine a response characterization associated with the mobile device 120. The process illustrated in FIG. 5 can be implemented by the vibration module 340 of the mobile device to provide baseline data in the form of a response characterization that can be used as a model of the effect that the vibration of the vibration motor 228 has on the inertial sensors 232 of the mobile device 120. The model data can be stored by the vibration module 340 and used to compensate for vibrations caused by the vibration motor 228 by using the response characterization. An example of such a process is illustrated in FIG. 6.

The vibration module 340 of the mobile device can be configured to automatically perform the calibration process illustrated in FIG. 5 or can be configured to perform the process illustrated in FIG. 5 in response to a specific event. For example, the vibration module 340 can be configured to automatically perform the process illustrated in FIG. 5 when the mobile device 120 is reset or booted up from a powered down state. The vibration module 340 can also be configured to periodically perform the calibration process illustrated in FIG. 5 at a predetermined interval. For example, the vibration module 340 could be configured to perform the calibration process daily, weekly, monthly, or at some other predetermined interval. The vibration module 340 can also be configured to perform the calibration process in response to a calibration request from a user. For example, the mobile device 120 can be configured to include calibration software that a user of the mobile device 120 could initiate to calibrate various aspects of the mobile device 120, such as touch sensors and/or the inertial sensors. Performing the calibration process illustrated in FIG. 5 to generate response characterization data can be part of the calibration software included on the software 224 of the mobile device. The calibration process illustrated in FIG. 5 can also be included with and/or initialized by diagnostic software for testing and for diagnosing problems with the mobile device 120.

The response characterization of a mobile device 120 might also change over time. For example, adding accessories to the mobile device 12 could affect the induced vibration of the mobile device 120 caused by actuation of the vibration motor 228. For example, the additional of a case to a mobile device might dampen the vibrations introduced by the vibration motor 228 to some extent. Periodically running the calibration process illustrated in FIG. 5 or on demand by a user after adding a new accessory to the mobile device 120 may provide a more accurate characterization of the induced vibration of the mobile device 12 by the vibration motor 228.

Sensor data output from the inertial sensors 232 can be measured during a period of time during which the vibration motor 228 is not inducing vibration in the mobile device 120 to produce baseline sensor output data (stage 505). The sensor module 342 can receive sensor output data from the inertial sensors 232 while the vibration motor 228 is not inducing vibrations in the mobile device 120 to provide the baseline sensor data output that can be compared to sensor data output while the vibration motor 228 is inducing vibrations in the mobile device 120.

The baseline sensor output data can be measured while the mobile device 120 is held relatively still (e.g. placed on a non-moving surface) to allow the vibration module 140 to collect data from the sensors without any motion of the mobile device 120 induced by influences outside of the mobile device, such as gestures and/or movements by a user of the mobile device 120. The baseline sensor output data can also be collected under the influence of motion of the mobile device 120 induced by influences outside of the mobile device 120. For example, the baseline sensor data can be collected as part of a calibration routine for the mobile device 120 in which the mobile device 120 prompts the user of the mobile device to make specified gestures and/or movements at specified intervals to provide a set of baseline inertial sensor output data that includes known movements of the mobile device and which can be later compared to sensor output data collected making these same known movements while the vibration motor 228 is inducing vibration of the mobile device 120.

Vibration of the mobile device 120 can be induced by actuating the vibration motor 228 of the mobile device for a test period of time (stage 510). The vibration module 340 of the mobile device 120 can induce the vibration of the vibration motor 228. The process illustrated in FIG. 5 can be repeated for multiple types of vibration-alerts where the vibration module 340 of the mobile device 120 is configured to induce the vibration motor 228 to produce vibrations having different patterns and/or duration for different alerts. The test period of time can be determined based on the pattern and/or duration of the alerts to for which data is to be collected. The test period of time can also be determined based on a calibration routines associated with the mobile device 120. For example, the calibration routine can be configured to prompt a user of the mobile device to make specified gestures and/or movements at specified intervals while a vibration pattern is being applied by inducing vibration of the mobile device 120 with by actuating the vibration motor 228.

Sensor data output from the inertial sensors 232 can be measured during the test period of time during which the vibration motor 228 is inducing vibration in the mobile device 120 to produce test sensor output data (stage 515). The vibration module 340 of the mobile device 120 can be configured to receive sensor data output from the sensor data module 342. The sensor data output collected while the vibration motor 228 is inducing vibration of the mobile device can be used to illustrate the effects of the vibrations on the inertial sensors 232.

Response characterization data can then be determined based on a comparison of the baseline sensor output data and the test sensor output data (stage 520). The vibration module 340 can be configured to compare the baseline sensor output data received from the inertial sensors 232 while the vibration motor 228 was not inducing vibration in the mobile device 120 with the sensor output data received from the inertial sensors 232 while the vibration motor 228 was inducing vibration in the mobile device 120. The vibration module 340 can generate response characterization data that represents the effects of the vibration motor 228 on the inertial sensors 232. The vibration module 340 can use the response characterization data to compensate for motion of the mobile device 120 induced by the vibration motor 228 when a subsequent vibration alert occurs. As indicated in the previous stages of this process, multiple vibration alert types having different patterns and/or durations can be tested during the test period of time and the test sensor output data collected during the test period can be compared to the baseline data to determine response characterization data for each of the vibration alert types.

The vibration module 340 of the mobile device 120 can be configured to determine relative time synchronization between the inertial sensors 232 when measuring the vibrations induced by the actuation of the vibration motor 228. The sensors may react to the induced vibration at slightly different times, and these differences in timing may be addressed during the compensation stage of the process. For example, in a mobile device 120 having both an accelerometer and a gyroscopic sensor, the relative time synchronization between the accelerometer and the gyroscopic sensor can be determined during this stage by analyzing the sensor data output for each of the sensors to determine whether the sensor response is synchronized or offset in time. The time synchronization information can be included with the response characterization data and can be used when compensating for vibrations of the mobile device 120 induced by the actuation of the vibration motor 228.

The response characterization data can then be stored in a memory associated with the mobile device 120 (stage 525). The vibration module 340 of the mobile device 120 can be configured to store the response characterization in the memory 222 of the mobile device 120 or another non-transitory, computer-readable storage medium. The stored response characterization can be used by the vibration module to compensate for vibrations of the mobile device 120 induced by the vibration motor 228. FIG. 6 illustrates an example of such a process whereby the stored response characterization can be used by the vibration module to compensate for vibrations of the mobile device 120.

FIG. 6 is block flow diagram of an example process for compensating for the vibration of the inertial sensor of the mobile device by offsetting inertial sensor output data based on response characterization data of an induced vibration of the mobile device 120. The process illustrated in FIG. 6 can use the response characterization data produced by the process illustrated in FIG. 5. The process illustrated in FIG. 6 can be implemented in the mobile device 120 illustrated in FIGS. 2 and 3.

Response characterization data associated with the vibration motor 228 of the mobile device 120 can be accessed (stage 605). The vibration module 340 can be configured to generate the response characterization data and to store the response characterization data in memory 222 of the mobile device and/or in another non-transitory memory associated with the mobile device 120. An example process for generating such data is illustrated in FIG. 5. The vibration module 340 can access the response characterization data stored the response characterization data in memory 222 and/or in the other non-transitory memory associated with the mobile device 120. As described above, response characterization data can be stored for multiple vibration alerts having different patterns and/or durations, and the vibration module 340 can be configured identify the type of vibration alert and to access the appropriate response characterization data for that particular type of vibration alert.

Sensor data output by the inertial sensors 232 can be offset based on the response characterization data (stage 610). The response characterization data can be used by the vibration module 340 to suppress known characteristics of the vibrations induced in the mobile device 120 by the vibration motor 228 generated in response to a vibration-alert event. For example, the vibration module 340 can be configured to use the response characterization data to determine a null frequency or set of null frequencies that can be applied to the sensor output data received from the inertial sensors 232. The null frequency or frequencies can be used to offset the effects of the vibrations induced by the vibration motor 228. The vibration module 340 can be configured to suppress known characteristics of the vibrations for each individual sensor and/or sensor type where the mobile device 120 includes more than one inertial sensor 232.

The response characterization data can also include information identifying the relative time synchronization between the inertial sensors 232 of the mobile device 120, and the vibration module 340 can use this information when offsetting the sensor data output from the inertial sensors 232 received while the vibration motor 228 is actuated. If the response by the inertial sensors 232 is not synchronized in time, the vibration module 340 can be configured to adjust for such a time offset when compensating for the vibrations of the mobile device 120 induced by the vibration motor 228.

The offset sensor data can be provided to the sensor data consumer as compensated sensor output data (stage 615). The vibration module 340 can provide the offset sensor data to one or more sensor data consumers. In one implementation, one or more modules of the mobile device 120 or one or more applications running on the mobile device that are configured to receive sensor output data from the inertial sensors. For example, the vibration module 340 can be configured to provide the offset sensor data to a game application running on the mobile device 120 that is configured to receive sensor output data from the inertial sensors 232. If the sensor data output from the inertial sensors 232 were provided to the game application without the compensation from the vibration module 340, the game algorithms using the inertial sensor output data may become confused and produce erroneous results due to the motion of the mobile device 120 induced by the vibration motor 228. Other types of module or applications that use inertial sensor output data could similarly produce erroneous results due to motion of the mobile device 120 caused by the vibration motor 228 during a vibration alert event. The compensated sensor output data can provide cleaner inertial sensor output data for use by inertial data sensor data consumers associated with the mobile device.

FIG. 7 is a block flow diagram of an example process for compensating for the vibration of the inertial sensor of a mobile device by filtering inertial sensor output data during a time period of induced vibrations of the mobile device. The process illustrated in FIG. 7 can be implemented by the mobile device 120. The process illustrated in FIG. 7 can be used to implement stage 415 of the process illustrated in FIG. 4.

Sensor data output by the inertial sensors 232 can be filtered to compensate for vibrations of the mobile device 120 induced by actuation of the vibration motor 228 (stage 705). The vibration module 340 can be configured to apply one or more filters to the sensor output data received from the inertial sensors to produce filtered sensor data that compensates for at least a portion of the effects of the vibrations caused by vibration motor 228 on the inertial sensors 232. The filters can be established by the manufacturer of the mobile device 120 and can be based on response characterization data developed based on measurements taken from a sample set of mobile device 120 by the manufacturer and/or based on models developed by the manufacturer.

The filtered sensor data can be provided to the inertial sensor output data consumer as compensated sensor output data until the vibration module 340 determines that the vibration motor 228 is no longer being actuated (stage 710). The vibration module 340 can be configured to provide the filtered sensor data to one or more inertial sensor output data consumers, such as one or more modules of the mobile device 120 and/or applications that use inertial sensor output data collected from the inertial sensors 232.

FIG. 8 is a block flow diagram of an example process for compensating for the vibration of the inertial sensor of a mobile device by blocking or blanking out inertial sensor output data during a time period of induced vibrations of the mobile device. The process illustrated in FIG. 8 can be implemented by the mobile device 120. The process illustrated in FIG. 8 can be used to implement stage 415 of the process illustrated in FIG. 4.

Inertial sensor output data from the inertial sensors 232 can be blocked or blanked out to in response to actuation of the vibration motor 228 of the mobile device 120 (stage 805). The vibration module 340 can be configured to block the sensor output data received from the inertial sensors 232 from reaching one or more inertial sensor output data consumers responsive to the vibration motor 228 being actuated in response to a vibration alert. The vibration module 340 can be configured to block the sensor output data from the inertial sensors 232 from reaching one or more inertial sensor output data consumers for the duration of the vibration alert or other event that triggers the actuation of the vibration motor 228.

The vibration module 340 can be configured to identify the type of event that triggered the actuation of the vibration motor 228 and to access information associated with that type of event to determine the duration and/or pattern of the vibration associated with that event. The vibration module 340 can then selectively block the sensor output data received from the inertial sensors 232 from reaching one or more inertial sensor output data consumers for the appropriate length of time and for the appropriate pattern of vibrations. For example, a particular event may be associated with an intermittent vibration pattern, and the vibration module 340 can be configured to block the inertial sensor output data during the periods in which the vibrations are induced and to allow the inertial sensor output data to pass through to the inertial sensor output data consumers during periods in which the vibrations are not being induced.

The vibration module 340 can be configured to output "blank" compensated inertial sensor output data while the vibration motor 228 is actuated. The blank data can comprise simulated sensor signal data that appears as though the mobile device 120 is being held in a predetermined default position and/or orientation for the duration of the vibration motor 228 being actuated in response to a vibration alert. In some implementations, the vibration module 340 can be configured to output inertial sensor output data received from the inertial sensors 232 prior to the actuation of the vibration motor 228. Outputting the inertial sensor output data received prior to the actuation of the vibration motor 228 in response to a vibration alert can make it appear to applications and/or other modules of the mobile device 120 that are consumers of the inertial sensor output data that the mobile device 120 has remained in the same position and/or orientation for the duration of the vibration alert that the mobile device 120 was in just prior to the vibration alert.

The blanked inertial sensor output data can be provided to the sensor data consumer until the vibration module 340 determines that the vibration induced by actuation of the vibration motor 228 is no longer being actuated (stage 810). The vibration module 340 can be configured to stop blanking the sensor data output received from the inertial sensors 232 once the vibration motor 228 is no longer being actuated. In some implementations, the vibration module 340 can be configured to recognize the type of vibration alert being executed and to blank out the data for the duration associated with the vibration alert. In other implementations, the vibration module 340 can be configured to blank out the sensor data output from the inertial sensors 232 any time that the vibration motor 228 of the mobile device is actuated.

Figures 9, 10:
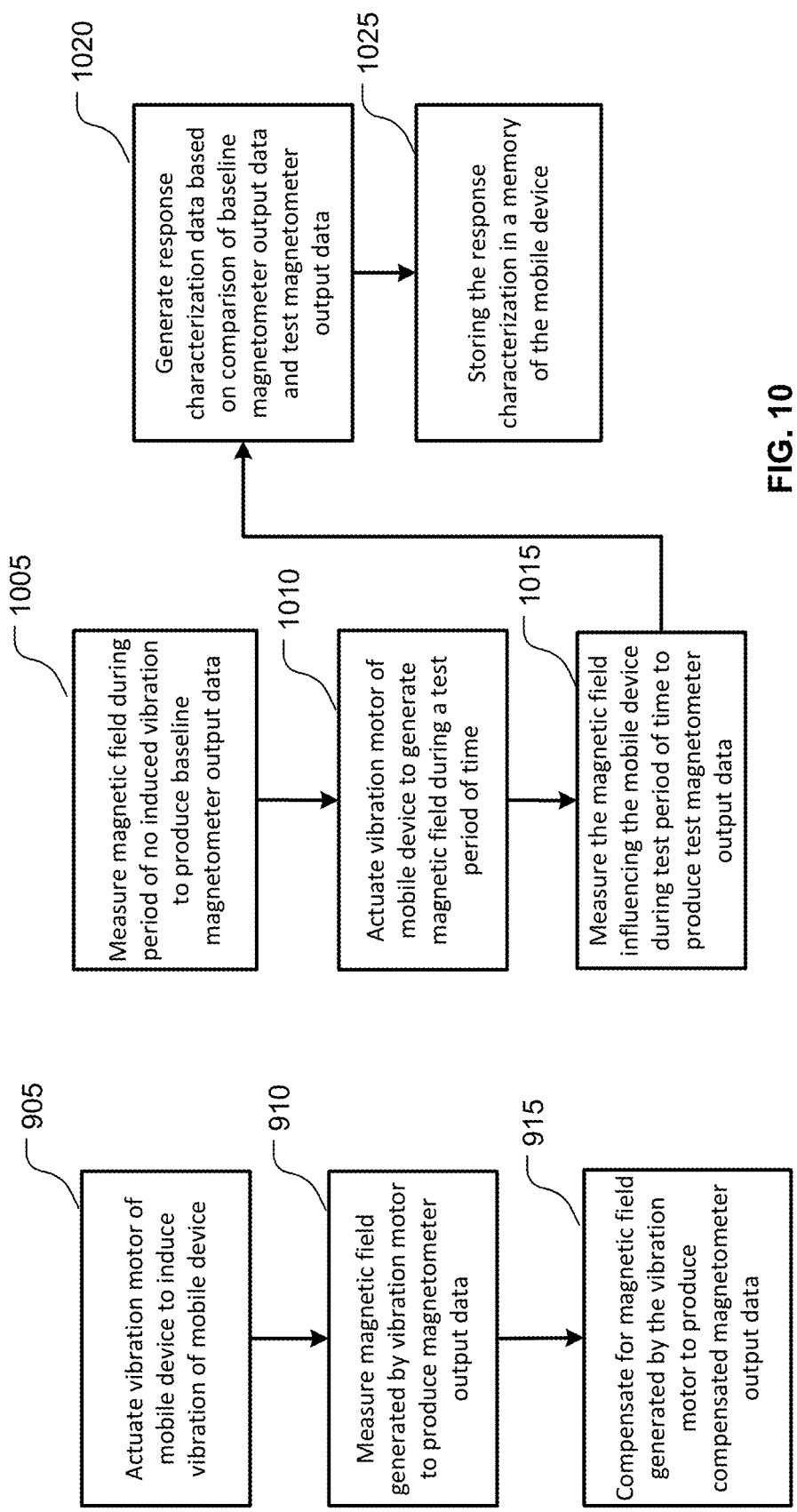
FIG. 9 is a block flow diagram of an example process for compensating for device driven magnetic interference.
FIG. 10 is a block flow diagram of an example process for determining a response characterization of a magnetic field generated by the vibration motor of the mobile device.

FIG. 9 is a block flow diagram of an example process for compensating for device driven magnetic interference. The process illustrated in FIG. 9 can be implemented by the mobile device 120 illustrated in FIG. 2 and FIG. 3. The process illustrated in FIG. 9 is similar to that illustrate in FIG. 4, but the process illustrated in FIG. 4 compensates for a magnetic field generated by the vibration motor 228 rather than compensating for vibration effects illustrated in FIG. 4. In some implementations, the processes illustrated in FIGS. 4 and 5 may both be implemented by the mobile device 120 and can be performed concurrently to compensate for both the vibration effects on the inertial sensors 232 and the effects of the magnetic field generated by the vibration motor 228 on the magnetometer 236.

The vibration motor 228 of mobile device 120 can be actuated to induce vibration of the mobile device 120 (stage 905). As described above with respect to stage 405 of the process illustrated in FIG. 4, the mobile device 120 can be configured to include a vibration-alert feature that can be used to alert the user of a mobile device to an event, such as an incoming call, an incoming text message, a calendar event, a navigation event, or other event that may require the attention of the user of the mobile device 120. The vibration module 340 of the mobile device 120 can be configured to actuate the vibration motor 228 of the mobile device 120 in response to a notification of an event from the operating system or an application running on the mobile device. The operating system and/or applications can be implemented in the software 224 stored in the memory 222 of the mobile device 120 or in another computer-readable memory associated with the mobile device. For example, the software can be stored on a removable media module, such as a flash drive, a Secure Digital (SD) card, or other type of non-volatile computer-readable memory card. The vibration module 340 can be configured to actuate the vibration motor 228 of the mobile device to induce the vibration motor 228 to produce vibrations having different patterns and/or duration for different alerts.

The magnetic field generated by the vibration motor 228 can then be measured with the magnetometer produce magnetometer output data (stage 910). The magnetometer can be configured to measure this magnetic field and/or other magnetic fields affecting the mobile device 120, including the Earth's magnetic field. The actuation of the vibration motor 228 not only induces the mobile device 120 to vibrate, but also can generate a magnetic field that can interfere with the magnetometer output data produced by the magnetometer 236. Accordingly, if the mobile device 120 were to provide the magnetometer output data directly to one or more magnetometer sensor data consumers, the use of the magnetometer output data by the magnetometer sensor data consumers may cause erroneous results in the magnetometer sensor data processing algorithms used by the consumers of this data. As a result, navigational application, games, gesture recognition applications, and/or other consumers of the magnetometer sensor data could produce poor results while the vibration motor 228 is actuated, which can negatively impact the user experience for users of the mobile device 120.

The magnetic field generated by the vibration motor 228 can be determined by comparing a measurement of the magnetic field influencing the mobile device 120 prior to actuating the vibration motor 228 and a measurement of the magnetic field influencing the mobile device 120 while the vibration motor 228 is being actuated. The Earth's magnetic field will influence the magnetometer 236 of the mobile device 120 prior to actuating the vibration motor 128. Other sources magnetic fields proximate to the mobile device may also influence the magnetometer 236 of the mobile device 120. When actuated, the vibration motor 228 can also produce a magnetic field that can influence the magnetometer. The effects of the magnetic field created by the vibration motor 228 can be determined by comparing measurements by magnetometer while the vibration motor 228 is not being actuated.

The magnetic field induced by actuation of the vibration motor 228 can then be compensated for to produce compensated magnetometer output data (stage 915). The vibration module 340 of the mobile device can be configured to receive sensor output data from the magnetometer 236 via the sensor module 342 and to generate compensated magnetometer output data that can reduce or eliminate the effects of the magnetic field generated by the vibration motor 228 that can introduce noise into the magnetometer data output of the magnetometer 236. Some examples of techniques for generating compensated magnetometer output data are provided in the processes illustrated in FIGS. 10-13, which are similar to those for generating compensated sensor data output illustrated in FIGS. 5-9. The compensated sensor output data can then be provided to one or more consumers of magnetometer output data. The compensated sensor magnetometer data includes magnetometer data that can reduce or eliminate the effects of the vibration of the mobile device 120 and may provide a better user experience for users of the mobile device 120.

FIG. 10 is a block flow diagram of an example process for determining a response characterization of a magnetic field induced by actuation of the vibration motor 228 of the mobile device 120. The process illustrated in FIG. 10 can be implemented at the time that the mobile device 120 is produced and/or can be implemented periodically to determine a response characterization associated with the mobile device 120. The process illustrated in FIG. 10 can be implemented by the vibration module 340 of the mobile device to provide baseline data in the form of a response characterization that can be used as a model of the effect that the magnetic field created by the vibration motor 228 has on the magnetometer 236 of the mobile device 120. The model data can be stored by the vibration module 340 and used to compensate for the magnetic field created by the vibration motor 228 by using the response characterization. An example of such a process is illustrated in FIG. 11.

The vibration module 340 of the mobile device can be configured to automatically perform the calibration process illustrated in FIG. 10 or can be configured to perform the process illustrated in FIG. 10 in response to a specific event. For example, the vibration module 340 can be configured to automatically perform the process illustrated in FIG. 10 when the mobile device 120 is reset or booted up from a powered down state. The vibration module 340 can also be configured to periodically perform the calibration process illustrated in FIG. 10 at a predetermined interval. For example, the vibration module 340 could be configured to perform the calibration process daily, weekly, monthly, or at some other predetermined interval. The vibration module 340 can also be configured to perform the calibration process in response to a calibration request from a user. For example, the mobile device 120 can be configured to include calibration software that a user of the mobile device 120 could initiate to calibrate various aspects of the mobile device 120, such as touch sensors and/or the inertial sensors. Performing the calibration process illustrated in FIG. 10 to generate response characterization data can be part of the calibration software included on the software 224 of the mobile device. The calibration process illustrated in FIG. 10 can also be included with and/or initialized by diagnostic software for testing and for diagnosing problems with the mobile device 120. In some implementations, the process illustrated in FIG. 10 may be executed either sequentially to or concurrently with the process illustrated in FIG. 5 in order to develop characterization data for both the vibration effects on the inertial sensors 232 and the magnetic field effects on the magnetometer 236.

The response characterization of a mobile device 120 might also change over time. Periodically running the calibration process illustrated in FIG. 10 or on demand by a user after adding a new accessory to the mobile device 120 may provide a more accurate characterization of the induced vibration of the mobile device 120 by the vibration motor 228.

Magnetic field data from the magnetometer 236 can be measured during a period of time during which the vibration motor 228 is not actuated or producing a magnetic field to produce baseline magnetometer output data (stage 1005). The sensor module 342 can receive magnetometer output data from the magnetometer 236 while the vibration motor 228 is not inducing vibrations in the mobile device 120 (a producing a magnetic field that can influence the magnetometer 236) to provide the baseline magnetometer data output that can be compared to magnetometer data output while the vibration motor 228 is inducing vibrations in the mobile device 120.

Vibration of the mobile device 120 can be induced by actuating the vibration motor 228 of the mobile device for a test period of time which causes the vibration motor 228 to generate a magnetic field (stage 1010). The vibration module 340 of the mobile device 120 can induce the vibration of the vibration motor 228 to cause the vibration motor 228 to generate a magnetic field that can influence the magnetometer 236. The process illustrated in FIG. 10 can be repeated for multiple types of vibration-alerts where the vibration module 340 of the mobile device 120 is configured to induce the vibration motor 228 to produce vibrations having different patterns and/or duration for different alerts. The magnetic field generated by the vibration motor 228 can be measured for these different patterns and/or durations. The test period of time can be determined based on the pattern and/or duration of the alerts to for which data is to be collected. The test period of time can also be determined based on a calibration routines associated with the mobile device 120.

Magnetometer data output from the magnetometer 236 can be measured during the test period of time during which the vibration motor 228 is inducing vibration in the mobile device 120 to produce test magnetometer output data (stage 1015). The vibration module 340 of the mobile device 120 can be configured to receive magnetometer data output from the sensor data module 342. The magnetometer data output collected while the vibration motor 228 is inducing vibration of the mobile device can be used to illustrate the effects of the magnetic field generated by the vibration motor 228 on the magnetometer 236.

Response characterization data can then be determined based on a comparison of the baseline magnetometer output data and the test magnetometer output data (stage 1020). The vibration module 340 can be configured to compare the baseline magnetometer output data received from the magnetometer 236 while the vibration motor 228 was not inducing vibration in the mobile device 120 with the magnetometer output data received from the magnetometer 236 while the vibration motor 228 was inducing vibration in the mobile device 120. The vibration module 340 can generate response characterization data that represents the effects of the vibration motor 228 on the magnetometer 236. The vibration module 340 can use the response characterization data to compensate for effects of the magnetic field generated by the vibration motor 228 when a subsequent vibration alert occurs. As indicated in the previous stages of this process, multiple vibration alert types having different patterns and/or durations can be tested during the test period of time and the test magnetometer output data collected during the test period can be compared to the baseline data to determine response characterization data for each of the vibration alert types.

The vibration module 340 of the mobile device 120 can be configured to determine relative time synchronization between the inertial sensors 232 and the magnetometer 236 when measuring the vibrations induced by the actuation of the vibration motor 228 and the magnetic field generated by the vibration motor 228. The inertial sensors 232 and the magnetometer may react to the induced vibration and the magnetic field generated by the vibration motor 228 at slightly different times, and these differences in timing may be addressed during the compensation stage of the process. For example, in a mobile device 120 having both an accelerometer and a gyroscopic sensor, the relative time synchronization between the accelerometer and the gyroscopic sensor can be determined during this stage by analyzing the sensor data output for each of the sensors to determine whether the sensor response is synchronized or offset in time. The time synchronization information can be included with the response characterization data and can be used when compensating for vibrations of the mobile device 120 induced by the actuation of the vibration motor 228.

The response characterization data can be stored in a memory associated with the mobile device 120 (stage 1025). The vibration module 340 of the mobile device 120 can be configured to store the response characterization in the memory 222 of the mobile device 120 or another non-transitory, computer-readable storage medium. The stored response characterization can be used by the vibration module to compensate for vibrations of the mobile device 120 induced by the vibration motor 228. FIG. 11 illustrates an example of such a process whereby the stored response characterization can be used by the vibration module to compensate for vibrations of the mobile device 120.

FIG. 11 is block flow diagram of an example process for compensating for the magnetic field generated by the vibration motor of the mobile device by offsetting magnetometer output data based on response characterization data of an induced vibration of the mobile device. The process illustrated in FIG. 11 can use the response characterization data produced by the process illustrated in FIG. 10. The process illustrated in FIG. 10 can be implemented in the mobile device 120 illustrated in FIGS. 2 and 3.

Response characterization data associated with the magnetic field generated by the vibration motor 228 of the mobile device 120 can be accessed (stage 1105). The vibration module 340 can be configured to generate the response characterization data and to store the response characterization data in memory 222 of the mobile device and/or in another non-transitory memory associated with the mobile device 120. An example process for generating such data is illustrated in FIG. 11. The vibration module 340 can access the response characterization data stored the response characterization data in memory 222 and/or in the other non-transitory memory associated with the mobile device 120. As described above, response characterization data can be stored for multiple vibration alerts having different patterns and/or durations, and the vibration module 340 can be configured identify the type of vibration alert and to access the appropriate response characterization data for that particular type of vibration alert.

Magnetometer data output by the magnetometer 236 can be offset based on the response characterization data (stage 1110). The response characterization data can be used by the vibration module 340 to suppress known characteristics of the magnetic field generated by the vibration motor 228 when the vibration motor 228 has been actuated in response to a vibration-alert event. The vibration module 340 can be configured to suppress known characteristics of the magnetic field generated by the vibration motor 228 of the mobile device.

The response characterization data can also include information identifying the relative time synchronization between the inertial sensors 232 and the magnetometer 236, and the vibration module 340 can use this information when offsetting both the sensor data output from the inertial sensors 232 received while the vibration motor 228 is actuated and the effects of magnetic field generated by the vibration motor 228. If the response by the inertial sensors 232 and the magnetometer 236 is not synchronized in time, the vibration module 340 can be configured to adjust for such a time offset when compensating for the vibrations of the mobile device 120 induced by the vibration motor 228 and for the effects of magnetic field generated by the vibration motor 228.

The offset sensor data can be provided to the sensor data consumer as compensated magnetometer output data (stage 1115). The vibration module 340 can provide the offset magnetometer data to one or more sensor data consumers. In one implementation, one or more modules of the mobile device 120 or one or more applications running on the mobile device that are configured to receive sensor output data from the inertial sensors. For example, the vibration module 340 can be configured to provide the offset sensor data to a navigation application running on the mobile device 120 that is configured to receive magnetometer output data from the magnetometer 236. If the magnetometer data output from the magnetometer 236 were provided to the navigation application without the compensation from the vibration module 340, the navigation algorithms using the magnetometer sensor data may become confused and produce erroneous results due to the magnetic field generated by the vibration motor 228. Other types of module or applications that use magnetometer sensor data output could similarly produce erroneous results due to the magnetic field generated by the vibration motor 228 during a vibration alert event. The compensated magnetometer output data can provide cleaner magnetometer sensor data for use by inertial data sensor data consumers associated with the mobile device.

FIG. 12 is a block flow diagram of an example process for compensating for the magnetic field generated by the vibration motor of a mobile device by filtering magnetometer output data during a time period of induced vibrations of the mobile device. The process illustrated in FIG. 12 can be implemented by the mobile device 120. The process illustrated in FIG. 12 can be used to implement stage 915 of the process illustrated in FIG. 9. Magnetometer data output by the inertial sensors 232 can be filtered to compensate for the magnetic field generated by the vibration mobile 228 of the mobile device 120 (stage 1205). The vibration module 340 can be configured to apply one or more filters to the magnetometer output data received from the magnetometer 236 to produce filtered magnetometer data that compensates for at least a portion of the effects of the magnetic field generated by the vibration motor 228. The filters can be established by the manufacturer of the mobile device 120 and can be based on response characterization data developed based on measurements taken from a sample set of mobile devices 120 by the manufacturer and/or based on models developed by the manufacturer.

The filtered magnetometer data can be provided to the magnetometer data consumer as compensated magnetometer output data until the vibration motor 228 is no longer actuated (stage 1210). The vibration module 340 can be configured to provide the filtered magnetometer data to one or more magnetometer data consumers, such as one or more modules of the mobile device 120 and/or applications that use magnetometer data collected from the magnetometer 236.

FIG. 13 is a block flow diagram of an example process for compensating for the magnetic field generated by the vibration motor 228 of a mobile device by blocking or blanking out magnetometer data during a time period during which the vibration motor 228 is actuated. The process illustrated in FIG. 13 can be implemented by the mobile device 120. The process illustrated in FIG. 13 can be used to implement stage 915 of the process illustrated in FIG. 9.

Magnetometer data from the magnetometer 236 can be blocked or blanked out to in response to actuation of the vibration motor 228 of the mobile device 120 (stage 1305). The vibration module 340 can be configured to block the magnetometer output data received from the magnetometer 236 from reaching one or more magnetometer output data consumers responsive to the vibration motor 228 being actuated in response to a vibration alert. The vibration module 340 can be configured to block the magnetometer output data from the magnetometer 236 from reaching one or more magnetometer output data consumers for the duration of the vibration alert or other event that triggers the actuation of the vibration motor 228.

The vibration module 340 can be configured to identify the type of event that triggered the actuation of the vibration motor 228 and to access information associated with that type of event to determine the duration and/or pattern of the vibration associated with that event. The vibration module 340 can then selectively block the magnetometer output data received from the magnetometer 236 from reaching one or more magnetometer output data consumers for the appropriate length of time and for the appropriate pattern of vibrations. For example, a particular event may be associated with an intermittent vibration pattern, and the vibration module 340 can be configured to block the magnetometer output data during the periods in which the vibrations are induced and to allow the magnetometer output data to pass through to the inertial sensor output data consumers during periods in which the vibrations are not being induced.

The vibration module 340 can be configured to output "blank" compensated magnetometer sensor output data while the vibration motor 228 is actuated. The blank data can comprise simulated sensor signal data that appears as though the mobile device 120 is being held in a predetermined default position and/or heading for the duration of the vibration motor 228 being actuated in response to a vibration alert. In some implementations, the vibration module 340 can be configured to output magnetometer sensor output data received from the magnetometer 236 prior to the actuation of the vibration motor 228. Outputting the magnetometer output data received prior to the actuation of the vibration motor 228 in response to a vibration alert can make it appear to applications and/or other modules of the mobile device 120 that are consumers of the magnetometer output data that the mobile device 120 has remained in the same position and/or has maintained the same heading for the duration of the vibration alert that the mobile device 120 was in just prior to the vibration alert.

The blanked magnetometer data can be provided to the sensor data consumer until the vibration module 340 determines that the vibration motor 228 is no longer being actuated (stage 1310). In some implementations, the vibration module 340 can be configured to recognize the type of vibration alert being executed and to blank out the data for the duration associated with the vibration alert. In other implementations, the vibration module 340 can be configured to blank out the magnetometer data output from the magnetometer 236 any time that the vibration motor 228 of the mobile device is actuated.

Other Considerations

As used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Further, a wireless communication network does not have all communications transmitted wirelessly, but is configured to have at least some communications transmitted wirelessly.

Other techniques and implementations than those explicitly discussed are possible.

What is claimed is:
1. A mobile device comprising:
a vibration motor configured to vibrate the mobile device;
an inertial sensor configured to sense motion of the mobile device and to provide sensor output data indicative of the motion; and
a processor communicatively coupled to the vibration motor and to the inertial sensor and configured to:

perform a calibration process to generate a response characterization of a test vibration on the mobile device during a test period of time;

after the test period of time, actuate the vibration motor to induce vibration of the mobile device;

measure motion of the mobile device with the inertial sensor of the mobile device to produce the sensor output data;

produce compensated sensor output data based on the sensor output data and the response characterization; and provide the compensated sensor output data to one or more components of the mobile device configured to utilize inertial sensor data to determine a position of the mobile device, movement of the mobile device, or both.

2. The mobile device of claim 1 wherein to produce the compensated sensor output data the processor is configured to blank the sensor output data during a time period of the test vibration.

3. The mobile device of claim 1 wherein to produce the compensated sensor output data the processor is configured to filter the sensor output data during the test time period of the test vibration.

4. The mobile device of claim 1 wherein to produce the compensated sensor output data the processor is configured to offset the sensor output data, during a time period of the test vibration, based on the response characterization of the test vibration.

5. The mobile device of claim 4 wherein the processor configured to generate the response characterization of the test vibration comprises the processor being configured to:

measure motion of the mobile device during period of no induced vibration to produce baseline sensor output data;

actuate the vibration motor of mobile device to induce the test vibration of the mobile device during the test period of time;

measure motion of mobile device during test period of time to produce test sensor output data; and generate the response characterization based on comparison of baseline sensor output data and test sensor output data.

6. The mobile device of claim 1 wherein the inertial sensor comprises at least one of an accelerometer or a gyroscope.

7. The mobile device of claim 1 wherein the processor is further configured to determine a sensor time synchronization based on actuation of the vibration motor.

8. The mobile device of claim 7 wherein the processor being configured to determine the sensor time synchronization based on actuation of the vibration motor is further configured to determine a timing offset associated with a response time of the inertial sensor by comparing a time at which the vibration motor was actuated with a timestamp associated with the inertial sensor output data.

9. The mobile device of claim 8 further comprising the processor being configured to compensate for the vibration of the inertial sensor induced by the vibration motor comprises the processor configured to compensate for the vibration of the inertial sensor based at least in part on the timing offset associated with a response time of the inertial sensor.

10. The mobile device of claim 8 wherein the mobile device includes a second inertial sensor, and wherein the processor is configured to determine a second timing offset associated with the response time of the second inertial sensor.

11. The mobile device of claim 10 further comprising the processor being configured to compensate for the vibration of the inertial sensor induced by the vibration motor comprises the processor configured to compensate for the vibration of the inertial sensor based at least in part on the timing offset associated with a response time of the inertial sensor and the second timing offset associated with the response time of the second inertial sensor.

12. A method comprising:

performing a calibration process to generate a response characterization of a test vibration on the mobile device during a test period of time;

after the test period of time, actuating a vibration motor of a mobile device to induce vibration of the mobile device;

measuring motion of the mobile device with an inertial sensor of the mobile device to produce sensor output data;

producing compensated sensor output data based on the sensor output data and the response characterization; and providing the compensated sensor output data to one or more components of the mobile device configured to utilize inertial sensor data to determine a position of the mobile device, movement of the mobile device, or both.

13. The method of claim 12 wherein the producing the compensated sensor output data comprises blanking the sensor output data from the inertial sensor during a time period of the test vibration.

14. The method of claim 12 wherein the producing the compensated sensor output data comprises filtering the sensor output data from the sensor during a time period of the test vibration.

15. The method of claim 12 wherein the producing the compensated sensor output data comprises offsetting the sensor output data, during the test time period of the test vibration, based on response characterization of the test vibration.

16. The method of claim 15, further comprising generating the response characterization of the test vibration comprises:

measuring motion of the mobile device during period of no induced vibration to produce baseline sensor output data;

actuating the vibration motor of mobile device to induce vibration of the mobile device during the test period of time;

measuring motion of mobile device during test period of time to produce test sensor output data; and generating the response characterization based on comparison of baseline sensor output data and test sensor output data and the response characterization.

17. The method of claim 12 wherein the measuring comprises measuring sensor output data from at least one of an accelerometer and a gyroscope.

18. The method of claim 12, further comprising determining a sensor time synchronization based on actuation of the vibration motor.

19. The method of claim 18 wherein determining the sensor time synchronization based on actuation of the vibration motor comprises determining a timing offset associated with a response time of the inertial sensor by comparing a time at which the vibration motor was actuated with a timestamp associated with the inertial sensor output data.

20. The method of claim 19, further comprising compensating for the vibration of the inertial sensor induced by the vibration motor by compensating for the vibration of the inertial sensor based at least in part on the timing offset associated with a response time of the inertial sensor.

21. The method of claim 19, further comprising:
   determining a second timing offset associated with the response time of a second inertial sensor.

22. The method of claim 21, further comprising compensating for the vibration of the inertial sensor induced by the vibration motor by compensating for the vibration of the inertial sensor based at least in part on the timing offset associated with a response time of the inertial sensor and the second timing offset associated with the response time of the second inertial sensor.

23. A mobile device comprising:
   means for performing a calibration process to generate a response characterization of a test vibration on the mobile device during a test period of time;
   means for actuating a vibration motor of a mobile device to induce vibration of the mobile device after the test period of time;
   means for measuring motion of the mobile device with an inertial sensor of the mobile device to produce sensor output data;
   means for producing compensated sensor output data based on the sensor output data and the response characterization; and
   means for providing the compensated sensor output data to one or more components of the mobile device configured to utilize inertial sensor data to determine a position of the mobile device, movement of the mobile device, or both.

24. The mobile device of claim 23 wherein the means for producing the compensated sensor output data includes means for blanking the sensor output data during a time period of the test vibration to produce the compensated sensor output data.

25. The mobile device of claim 23 wherein the means for producing the compensated sensor output data includes means for filtering the sensor output data during a time period of the test vibration to produce the compensated sensor output data.

26. The mobile device of claim 23 wherein the means for producing the compensated sensor output data includes means for offsetting the sensor output data, during the test time period of the test vibration, based on a response characterization of the test vibration to produce the compensated sensor output data.

27. The mobile device of claim 26, further comprising means for generating the test characterization of the test vibration, the means for generating the test characterization comprising:
   means for measuring motion of the mobile device during period of no induced vibration to produce baseline sensor output data;
   means for actuating the vibration motor of mobile device to induce vibration of the mobile device during the test period of time;
   means for measuring motion of mobile device during test period of time to produce test sensor output data; and
   means for generating the response characterization based on comparison of baseline sensor output data and test sensor output data.

28. The mobile device of claim 23 wherein the means for measuring comprises means for measuring sensor output data from at least one of an accelerometer and a gyroscope.

29. The mobile device of claim 23, further comprising means for determining a sensor time synchronization based on a timing of the test vibration.

30. The mobile device of claim 29 wherein the means for determining the sensor time synchronization based on a timing of the test vibration comprises means for determining a timing offset associated with a response time of the inertial sensor by comparing a time at which the vibration motor was actuated with a timestamp associated with the inertial sensor output data.

31. The mobile device of claim 30, further comprising means for compensating for the vibration of the inertial sensor induced by the vibration motor, the means for compensating for the vibration of the inertial sensor further comprises means for compensating for the vibration of the inertial sensor based at least in part on the timing offset associated with a response time of the inertial sensor.

32. The mobile device of claim 30, further comprising:
   means for determining a second timing offset associated with the response time of a second inertial sensor.

33. The mobile device of claim 32, further comprising means for compensating for the vibration of the inertial sensor induced by the vibration motor, the means for compensating for the vibration of the inertial sensor further comprises means for compensating for the vibration of the inertial sensor based at least in part on the timing offset associated with a response time of the inertial sensor and the second timing offset associated with the response time of the second inertial sensor.

34. A non-transitory, computer-readable medium storing processor-readable instructions configured to cause the processor to:
   perform a calibration process to generate a response characterization of a test vibration on the mobile device during a test period of time;
   after the test period of time, actuate a vibration motor of a mobile device to induce vibration of the mobile device;
   measure motion of the mobile device with an inertial sensor of the mobile device to produce sensor output data;
   produce compensated sensor output data based on the sensor output data; and
   provide the compensated sensor output data to one or more components of the mobile device configured to utilize inertial sensor data to determine a position of the mobile device, movement of the mobile device, or both.

35. The medium of claim 34 wherein the instructions configured to cause the processor to compensate for the vibration of the inertial sensor induced by the vibration motor to produce the compensated sensor output data based on the sensor output data further comprise instructions configured to cause the processor to compensate for the vibration of the inertial sensor by blanking the motion data during a time period of the test vibration to produce the compensated sensor output data.

36. The medium of claim 34 wherein the instructions configured to cause the processor to compensate for the vibration of the inertial sensor induced by the vibration motor to produce the compensated sensor output data based on the sensor output data further comprise instructions configured to cause the processor to compensate for the vibration of the inertial sensor by filtering the motion data from the sensor during a time period of the test vibration to produce the compensated sensor output data.

37. The medium of claim 34 wherein the instructions configured to cause the processor to compensate for the vibration of the inertial sensor induced by the vibration motor to produce the compensated sensor output data based on the sensor output data further comprise instructions configured to cause the processor to compensate for the vibration of the inertial sensor by offsetting the motion data, during a time period of the test vibration, based on the response characterization of the test vibration to produce the compensated sensor output data.

38. The medium of claim 37, further comprising instructions configured to cause the processor to generate the response characterization of the test vibration, the instructions configured to cause the processor to generate the response characterization further comprising instructions to cause the processor to:
- measure motion of the mobile device during period of no induced vibration to produce baseline sensor output data;
- actuate the vibration motor of mobile device to induce vibration of the mobile device during the test period of time;
- measure motion of mobile device during test period of time to produce test sensor output data; and
- generate the response characterization based on comparison of baseline sensor output data and test sensor output data.

39. The medium of claim 34 wherein the instructions for causing the processor to measure comprise instructions configured to cause the processor to measure sensor output data from at least one of an accelerometer and a gyroscope.

40. The medium of claim 34, further comprising instructions configured to cause the processor to determine a sensor time synchronization based on a timing of the test vibration.

41. The medium of claim 40 wherein the instructions for causing the processor to determine the sensor time synchronization based on a timing of the test vibration further comprise instructions for causing the processor to determine a timing offset associated with a response time of the inertial sensor by comparing a time at which the vibration motor was actuated with a timestamp associated with the inertial sensor output data.

42. The medium of claim 41, further comprising instructions for causing the processor to compensate for the vibration of the inertial sensor induced by the vibration motor further comprise instructions for causing the processor to compensate for the vibration of the inertial sensor based at least in part on the timing offset associated with a response time of the inertial sensor.

43. The medium of claim 41 further comprising instructions for causing the processor to determine a second timing offset associated with the response time of the second inertial sensor associated with the mobile device.

44. The medium of claim 43, further comprising instructions for causing the processor to compensate for the vibration of the inertial sensor induced by the vibration motor further comprise instructions for causing the processor to compensate for the vibration of the inertial sensor based at least in part on the timing offset associated with a response time of the inertial sensor and the second timing offset associated with the response time of the second inertial sensor.

\* \* \* \* \*